(12) United States Patent
Yamazaki

(10) Patent No.: US 7,710,028 B2
(45) Date of Patent: May 4, 2010

(54) EL DISPLAY DEVICE HAVING PIXEL ELECTRODE WITH PROJECTING PORTIONS AND MANUFACTURING METHOD THEREOF

(75) Inventor: Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 3 days.

(21) Appl. No.: 12/208,528

(22) Filed: Sep. 11, 2008

(65) Prior Publication Data

US 2009/0051270 A1    Feb. 26, 2009

Related U.S. Application Data

(63) Continuation of application No. 10/943,089, filed on Sep. 16, 2004, now Pat. No. 7,427,834, which is a continuation of application No. 10/384,807, filed on Mar. 10, 2003, now Pat. No. 7,012,300, which is a continuation of application No. 10/186,398, filed on Jul. 1, 2002, now Pat. No. 6,555,969, which is a continuation of application No. 09/644,429, filed on Aug. 23, 2000, now Pat. No. 6,433,487.

(30) Foreign Application Priority Data

Sep. 3, 1999    (JP)    ................................ 11-250965
Nov. 26, 1999    (JP)    ................................ 11-336249

(51) Int. Cl.
*H05B 33/00* (2006.01)
*H05B 33/06* (2006.01)
*H01J 1/62* (2006.01)

(52) U.S. Cl. ....................... 313/506; 313/504; 313/512; 257/82; 257/343

(58) Field of Classification Search ................. 313/504, 313/506
See application file for complete search history.

(56) References Cited

U.S. PATENT DOCUMENTS 2,819,191 A    1/1958    Fuller (Continued)

FOREIGN PATENT DOCUMENTS

EP    0 084 581 A1    8/1983

(Continued)

OTHER PUBLICATIONS

European Search Report re application No. EP 00119026.3, dated Nov. 3, 2003.

(Continued)

*Primary Examiner*—Sikha Roy
(74) *Attorney, Agent, or Firm*—Cook Alex Ltd.

(57) ABSTRACT

Reducing the manufacturing cost of an EL display device and an electronic device furnished with the EL display device is taken as an objective. A textured structure in which projecting portions are formed on the surface of a cathode is used. External stray light is diffusely (irregularly) reflected by the action of the projecting portions when reflected by the surface of the cathode, and therefore a defect in which the face of an observer or the surrounding scenery is reflected in the surface of the cathode can be prevented. This can be completed without using a conventionally necessary high price circular polarizing film, and therefore it is possible to reduce the cost of manufacturing the EL display device.

18 Claims, 13 Drawing Sheets

U.S. PATENT DOCUMENTS

| | | | |
|---|---|---|---|
| 4,103,297 | A | 7/1978 | McGreivy et al. |
| 4,438,654 | A | 3/1984 | Torstensson |
| 5,003,356 | A | 3/1991 | Wakai et al. |
| 5,643,826 | A | 7/1997 | Ohtani et al. |
| 5,711,824 | A | 1/1998 | Shinohara et al. |
| 5,820,996 | A | 10/1998 | Hirai et al. |
| 5,834,893 | A | 11/1998 | Bulovic et al. |
| 5,882,761 | A | 3/1999 | Kawami et al. |
| 5,891,264 | A | 4/1999 | Shinohara et al. |
| 5,923,962 | A | 7/1999 | Ohtani et al. |
| 5,998,926 | A | 12/1999 | Tsuruoka et al. |
| 6,056,614 | A | 5/2000 | Adachi |
| 6,072,450 | A | 6/2000 | Yamada et al. |
| 6,081,310 | A | 6/2000 | Katsuya et al. |
| 6,175,345 | B1 | 1/2001 | Kuribayashi et al. |
| 6,198,217 | B1 | 3/2001 | Suzuki et al. |
| 6,204,081 | B1 | 3/2001 | Kim et al. |
| 6,211,613 | B1 | 4/2001 | May |
| 6,218,206 | B1 | 4/2001 | Inoue et al. |
| 6,242,290 | B1 | 6/2001 | Nakajima et al. |
| 6,277,679 | B1 | 8/2001 | Ohtani |
| 6,278,236 | B1 | 8/2001 | Madathil et al. |
| 6,303,963 | B1 | 10/2001 | Ohtani et al. |
| 6,373,455 | B1 | 4/2002 | Kuribayashi et al. |
| 6,407,430 | B1 | 6/2002 | Ohtani et al. |
| 6,433,767 | B1 | 8/2002 | Murade |
| 6,462,722 | B1 | 10/2002 | Kimura et al. |
| 6,476,419 | B1 | 11/2002 | Yasuda |
| 6,512,504 | B1 | 1/2003 | Yamauchi et al. |
| 6,518,594 | B1 | 2/2003 | Nakajima et al. |
| 6,522,315 | B2 | 2/2003 | Ozawa et al. |
| 6,545,320 | B2 | 4/2003 | Ohtani et al. |
| 6,618,029 | B1 | 9/2003 | Ozawa |
| 6,621,535 | B1 | 9/2003 | Fukada |
| 6,781,652 | B1 | 8/2004 | Nishi |
| 6,839,045 | B2 | 1/2005 | Ozawa et al. |
| 7,180,483 | B2 | 2/2007 | Kimura et al |
| 7,221,339 | B2 | 5/2007 | Ozawa et al. |
| 7,250,994 | B2 | 7/2007 | Nishi |
| 7,253,793 | B2 | 8/2007 | Ozawa et al. |
| 7,397,451 | B2 | 7/2008 | Ozawa |
| 2001/0013912 | A1 | 8/2001 | Yamazaki et al. |
| 2001/0026123 | A1 | 10/2001 | Yoneda |
| 2002/0000613 | A1 | 1/2002 | Ohtani et al. |
| 2003/0231273 | A1 | 12/2003 | Kimura et al. |
| 2006/0273995 | A1 | 12/2006 | Ozawa et al. |
| 2006/0273996 | A1 | 12/2006 | Ozawa et al. |
| 2006/0279491 | A1 | 12/2006 | Ozawa et al. |
| 2008/0246700 | A1 | 10/2008 | Ozawa et al. |
| 2009/0072758 | A1 | 3/2009 | Kimura et al. |
| 2009/0167148 | A1 | 7/2009 | Kimura et al. |

FOREIGN PATENT DOCUMENTS

| | | |
|---|---|---|
| EP | 0 776 147 A1 | 5/1997 |
| EP | 0 788 297 A1 | 8/1997 |
| EP | 0 845 812 A2 | 6/1998 |
| EP | 0 883 191 A2 | 12/1998 |
| EP | 0 895 219 A1 | 2/1999 |
| EP | 0 917 127 A1 | 5/1999 |
| EP | 0 935 229 A1 | 8/1999 |
| EP | 1 255 240 A1 | 11/2002 |
| EP | 1 336 953 A2 | 8/2003 |
| EP | 1 337 131 A2 | 8/2003 |
| EP | 1 359 789 A1 | 11/2003 |
| EP | 1 363 265 A2 | 11/2003 |
| EP | 1 505 650 A2 | 2/2005 |
| EP | 1 505 651 A2 | 2/2005 |
| EP | 1 505 652 A2 | 2/2005 |
| EP | 1 619 654 A1 | 1/2006 |
| EP | 1 830 342 A2 | 9/2007 |
| EP | 1 830 343 A2 | 9/2007 |
| EP | 1 830 344 A2 | 9/2007 |
| EP | 2 112 693 A2 | 10/2009 |
| EP | 2 151 865 A1 | 2/2010 |
| GB | 2 321 781 A | 8/1998 |
| JP | 62-90260 | 4/1987 |
| JP | 7-130652 | 5/1995 |
| JP | 8-330602 | 12/1996 |
| JP | 9-69642 | 3/1997 |
| JP | 9-148066 | 6/1997 |
| JP | 10-144927 | 5/1998 |
| JP | 10-161564 | 6/1998 |
| JP | 10-172767 | 6/1998 |
| JP | 10-189252 | 7/1998 |
| JP | 10-270363 | 10/1998 |
| JP | 10-319872 | 12/1998 |
| JP | 11-3048 | 1/1999 |
| JP | 11-24606 | 1/1999 |
| JP | 11-76967 | 3/1999 |
| JP | 11-218751 | 8/1999 |
| JP | 2000-174282 | 6/2000 |
| JP | 2000-231347 | 8/2000 |
| KR | 1999-024437 | 4/1999 |
| WO | WO 97/38452 A1 | 10/1997 |
| WO | WO 98/36407 A1 | 8/1998 |
| WO | WO 00/07207 A1 | 2/2000 |

OTHER PUBLICATIONS

Office Action re Korean application No. KR 10-2007-0095766, dated Nov. 29, 2007 (with English translation).

FIG. 4A CRYSTALLIZATION

FIG. 4B STEP OF ADDING N-TYPE IMPURITY

FIG. 4C LASER ANNEALING STEP

*FIG. 5A* STEP OF ADDING N-TYPE IMPURITY

*FIG. 5B* STEP OF ADDING N-TYPE IMPURITY

*FIG. 5C* STEP OF ADDING P-TYPE IMPURITY

L1 = L1a + L1b

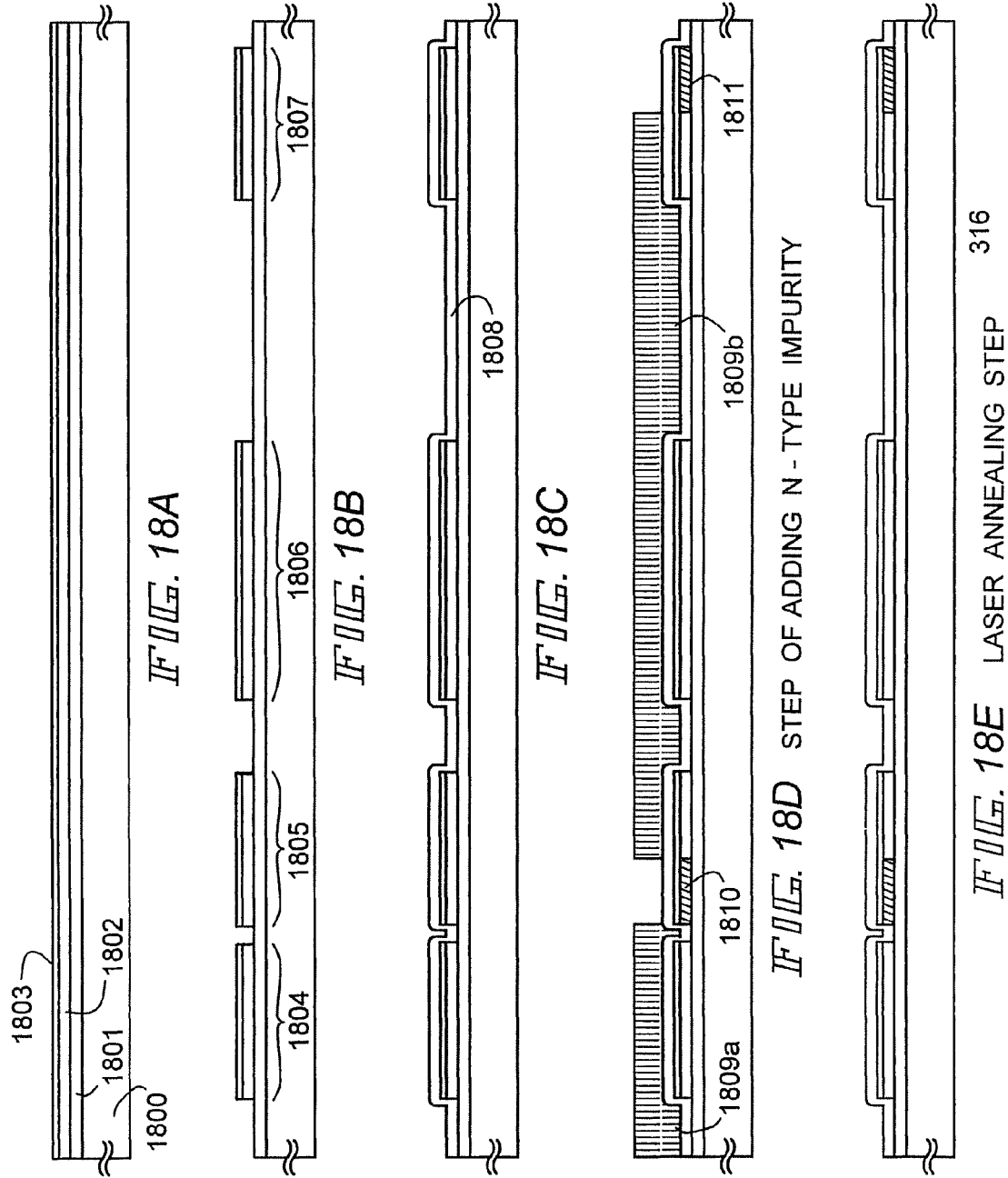

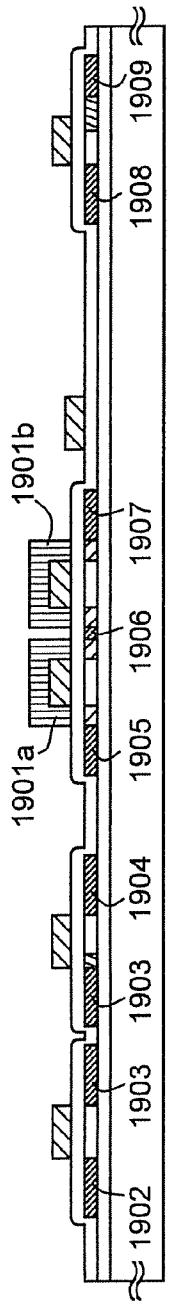
FIG. 19A STEP OF ADDING N-TYPE IMPURITY
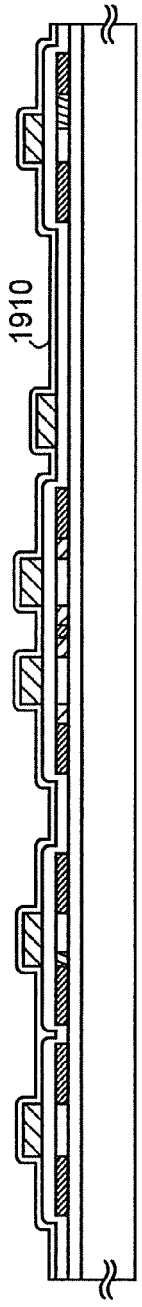
FIG. 19B GETTERING PROCESS AND ACTIVATION PROCESS
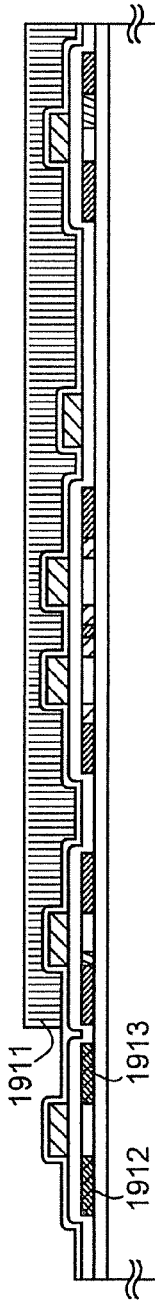
FIG. 19C STEP OF ADDING P-TYPE IMPURITY
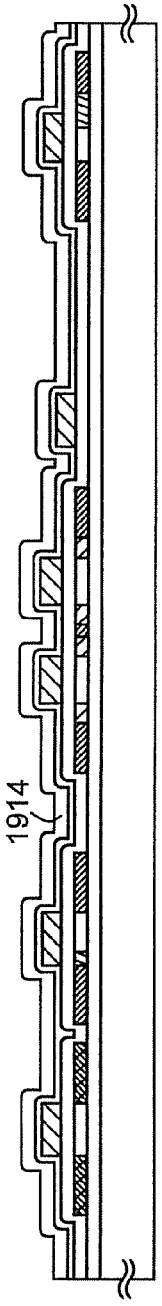
FIG. 19D HYDROGENATION PROCESS AND ACTIVATION PROCESS

EL DISPLAY DEVICE HAVING PIXEL ELECTRODE WITH PROJECTING PORTIONS AND MANUFACTURING METHOD THEREOF

This application is a continuation of U.S. application Ser. No. 10/943,089, filed on Sep. 16, 2004, now U.S. Pat. No. 7,427,834, which is a continuation of U.S. application Ser. No. 10/384,807 filed on Mar. 10, 2003 (now U.S. Pat. No. 7,012,300 issued Mar. 14, 2003) which is a continuation of U.S. application Ser. No. 10/186,398, filed on Jul. 1, 2002 (now U.S. Pat. No. 6,555,969 issued Apr. 29, 2003) which is a continuation of U.S. application Ser. No. 09/644,429, filed on Aug. 23, 2000 (now U.S. Pat. No. 6,433,487 issued on Aug. 13, 2002).

BACKGROUND OF THE INVENTION

1. Field of the Invention

The present invention relates to an electro-optical device, typically an EL (electroluminescence) display device, and an electronic device (electronic equipment) having the electro-optical device as a display.

2. Description of the Related Art

The development of electro-optical devices, typically EL (electroluminescence) display devices using organic material for electroluminescence, has been proceeding at a rapid pace in recent years. There are two types of EL display devices, passive matrix type EL display devices and active matrix type EL display devices.

Regardless of whether a passive matrix type or an active matrix type, the EL display device has a capacitor structure with an EL layer sandwiched by a cathode and an anode (an element having this type of structure is referred to as an EL element throughout this specification), and the EL display device operates under the principle of causing the EL layer to luminesce by the flow of electric current. A metallic electrode is generally used for the cathode, which is an electron supply source, and a transparent conducting film is generally used for the anode, which is a hole supply source. This is done because if one of the pair of electrodes is not transparent, the light emitted from the luminescing layer cannot be extracted.

In this case, the light emitted by the EL layer is directly output to the anode side, and light directed toward the cathode side is also output to the anode side after being reflected by the cathode. In other words, it is necessary for an observer to view the display device from the anode side.

However, light having a wavelength corresponding to the material of the luminescing layer can be seen from a portion of the EL layer emitting light, but in a portion of the EL layer not emitting light, the surface of the back surface side of the electrode (light emitting layer side) can be seen through the anode and the EL layer. This means that the back surface of the electrode therefore functions as a mirror, and the face of the observer is reflected.

In order to avoid this, a method of attaching a circular polarization film to the EL display device so that the observer's face is not reflected is employed, but there is a problem in that the circular polarization film is extremely high cost, therefore leading to increased manufacturing costs.

SUMMARY OF THE INVENTION

The present invention is made in view of the above problems, and an object of the present invention is to prevent an EL display device from becoming mirrored, and to provide a low cost EL display device in which the EL display device manufacturing cost has been reduced. In addition, an object of the present invention is to lower the cost of an electronic device having a display using the EL display device.

The present invention is characterized in that a projecting portion is formed on a reflecting surface of a cathode (a surface contacting a luminescing layer side), and light reflected by the reflecting surface of the cathode is scattered. Namely, the present invention is characterized in that the reflecting surface of the cathode is made not visible to an observer by diffusely (irregularly) reflecting visible light (external light) incident from an anode side by using the reflecting surface of the cathode.

The textured portion formed on the reflecting surface of the cathode may be formed by concave shape depressions, or by convex shape projections. Further, a wave shape surface in which the unevenness is repeated may also be used. The projecting portion may be formed by a technique such as photolithography or holography (for example, a technique of forming an uneven reflecting structure recorded in Sharp Technology Reports, No. 74, pp. 16-9, Aug. 1-999), and may also be formed by surface processing, such as plasma treatment or etching. Further, the projecting portion may also be naturally generated in the surface by using the film deposition conditions of the cathode (or a base electrode).

In other words, the formation of the projecting portion may be regulated or unregulated, but it must be formed so as to average a diffused reflection (irregular reflection) within the surface of a pixel. A structure in which the projecting portion is formed as explained above is referred to as a textured structure throughout this specification.

Further, by forming projecting portions in other thin films contacting the cathode, and then forming the cathode on top, the projecting portion can be formed in the reflecting surface of the cathode. In particular, Japanese Patent Application Laid-open No. Hei 9-69642 and Japanese Patent Application Laid-open No. Hei 10-144927 can be cited for means of forming the projecting portion in an aluminum film. Namely, by forming the aluminum film based on the above patent applications, and by laminating the cathode on top of the aluminum film, it is possible to obtain a cathode having the projecting portion.

BRIEF DESCRIPTION OF THE DRAWINGS

In the accompanying drawings:

FIGS. 4A to 4E are diagrams showing a process of manufacturing an active matrix type EL display device;

FIGS. 5A to 5D are diagrams showing the process of manufacturing the active matrix type EL display device;

FIGS. 18A to 18E are diagrams showing a process of manufacturing an active matrix type EL display device; and FIGS. 19A to 19D are diagrams showing a process of manufacturing an active matrix type EL display device.

DETAILED DESCRIPTION OF THE PREFERRED EMBODIMENTS

Embodiment Mode 1

Figure 1:
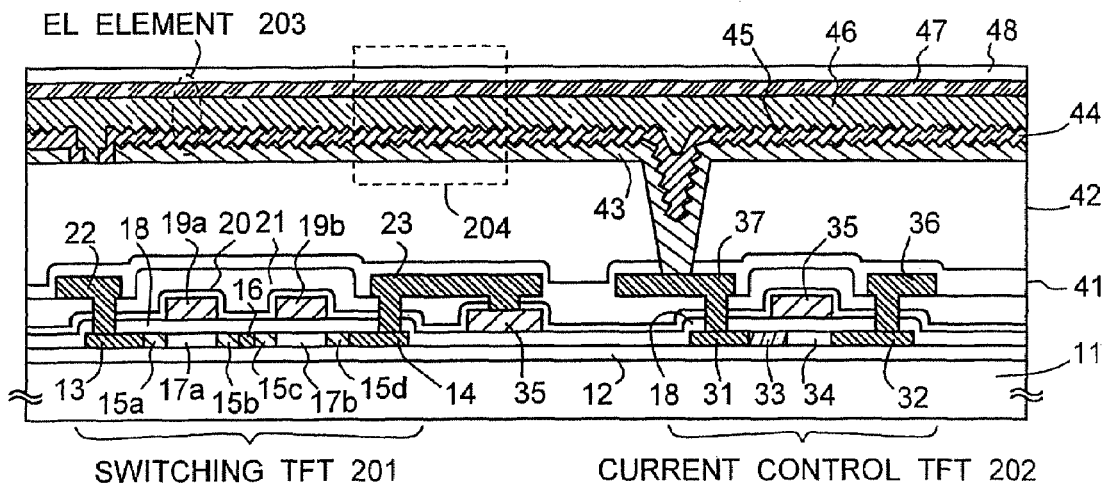
FIG. 1 is a diagram showing a cross sectional structure of a pixel portion of an EL display device.
Figure 2:
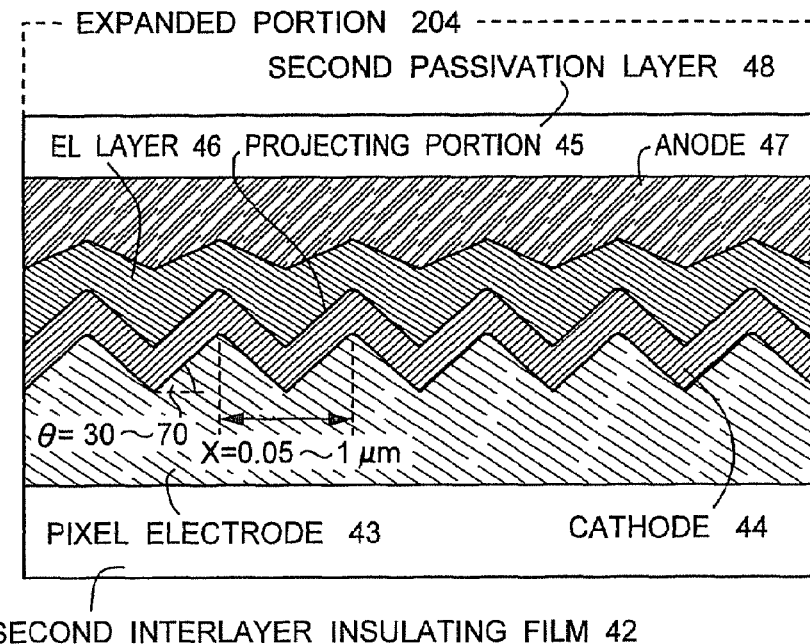
FIG. 2 is a diagram showing an enlargement of an EL element.
Figure 3A:
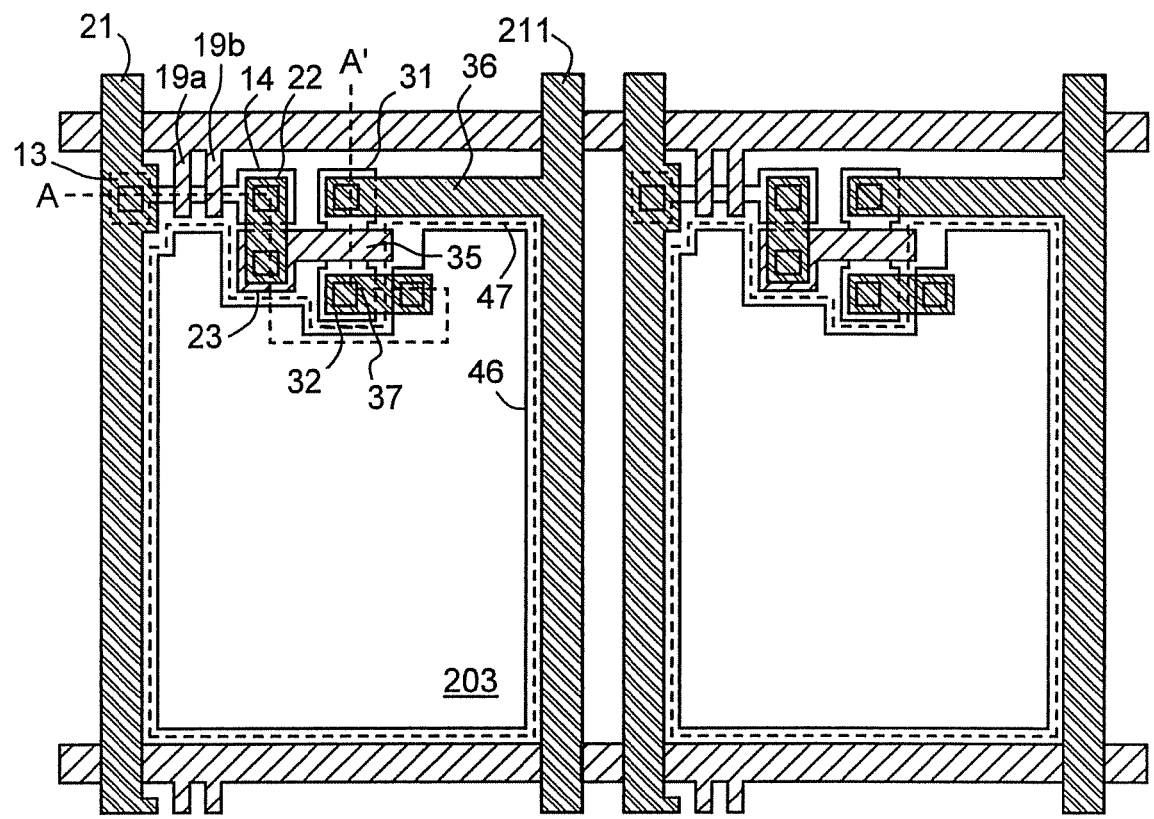
FIGS. 3A and 3B are diagrams showing a top surface structure and a circuit structure of a pixel portion of an EL display device.
Figure 3B:
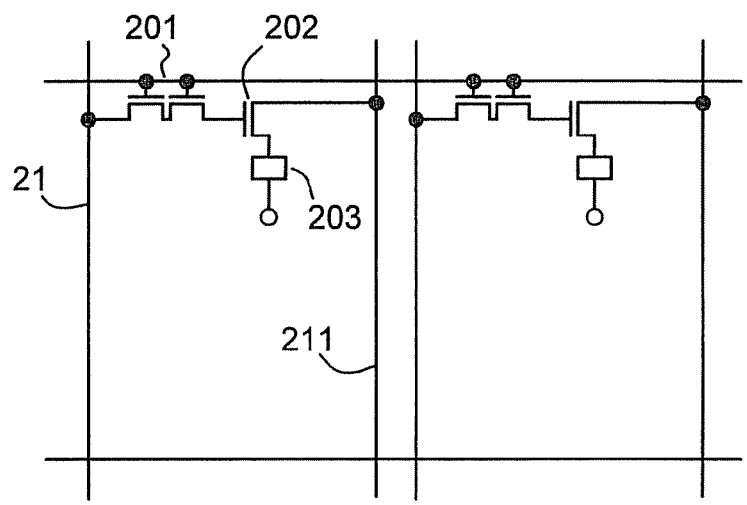

Embodiment mode 1 of the present invention will be explained using FIGS. 1 to 3B. Shown in FIG. 1 is a cross sectional diagram of a pixel portion of an EL display device of the present invention, while FIG. 2 shows an enlargement of a portion of FIG. 1. FIG. 3A is a top view of the EL display device, and FIG. 3B is a circuit diagram of the EL display device. In practice, a plurality of pixels arranged in a matrix shape is formed as the pixel portion (image display portion). Note that common symbols are used in FIGS. 1 to 3B, and therefore each of the diagrams may be suitably referred to. Further, two pixels are shown in the top view of FIG. 3A, but both have the same structure, and therefore only one is explained.

In FIG. 1, a reference numeral 11 designates a substrate; and 12, an insulating film (hereinafter referred to as an under film) which becomes an undercoat. A glass substrate, a glass ceramic substrate, a quartz substrate, a silicon substrate, a ceramic substrate, a metal substrate, or a plastic substrate (including a plastic film as well) can be used as the substrate 11.

As the under film 12, an insulating film containing silicon may be used. Note that in the present specification, the "insulating film containing silicon" indicates an insulating film containing silicon, oxygen and nitrogen at a predetermined ratio, for example, a silicon oxide film, a silicon nitride film, or a silicon nitride oxide film (indicated by SiOxNy).

Here, two TFTs are formed in the pixel. A reference numeral 201 designates a TFT (hereinafter referred to as a switching TFT) functioning as a switching element; and 202, a TFT (hereinafter referred to as a current controlling TFT) functioning as a current controlling element for controlling the amount of current flowing to the EL element. Both are formed out of an n-channel TFT but a p-channel TFT may also be used.

The switching TFT 201 has: an active layer containing a source region 13, a drain region 14, LDD regions (lightly doped regions) 15a to 15d, a high concentration impurity region 16, and channel forming regions 17a and 17b; a gate insulating film 18; gate electrodes 19a and 19b; a protecting film 20 made from a silicon nitride oxide film; a first interlayer insulating film 21; a source wiring 22; and a drain wiring 23. Note that the drain region 14 is electrically connected to a gate electrode 35 of the current control TFT 202 through the drain wiring 23.

Besides, the gate electrodes 19a and 19b are of a double gate structure and also in addition to the double gate structure, a so-called multi-gate structure (structure including an active layer having two or more channel formation regions connected in series with each other), such as a triple gate structure, may be adopted. The multi-gate structure is extremely effective in reducing the off current value, and is an extremely effective structure as the switching element of a pixel.

The active layer is formed out of a semiconductor film containing a crystal structure. That is, a single crystal semiconductor film may be used or a polycrystalline semiconductor film or microcrystalline semiconductor film may be used. The gate insulating film 18, the protecting film 20 and the first interlayer insulating film 21 may be formed out of an insulating film containing silicon. Besides, any conductive films can be used for the gate electrodes 19a and 19b, source wiring line 21, or drain wiring line 22.

Further, in the switching TFT 201, the LDD regions 15a to 15d are provided not to overlap with the gate electrodes 17a and 17b, with the gate insulating film 18 put between the LDD regions and the gate electrodes. Such structure is very effective in reducing the off current value.

Note that it is more desirable to provide an offset region (region which is made of a semiconductor layer having the same composition as the channel formation region and to which a gate voltage is not applied) between the channel formation region and the LDD region in order to reduce the off current. In the case of multi-gate structure having two or more gate electrodes, a high concentration impurity region provided between the channel formation regions is effective in reducing the off current value.

As described above, by using the TFT of the multi-gate structure as the switching TFT 201 of the pixel, it is possible to realize the switch element having a sufficiently low off current value. Thus, even if a condenser as shown in FIG. 2 of Japanese Patent Application Laid-open No. Hei 10-189252 is not provided, the gate voltage of the current controlling TFT can be held for a sufficient time (an interval between a selected point and a next selected point).

That is, it becomes possible to remove a condenser which has conventionally been a factor to narrow an effective light emitting area, and it becomes possible to widen the effective light emitting area. This means that the picture quality of the EL display device can be made bright.

Next, the current controlling TFT 202 includes an active layer including a source region 31, a drain region 32, an LDD region 33 and a channel formation region 34, a gate insulating film 18, a gate electrode 35, a protecting film 20, the first interlayer insulating film 21, a source wiring line 36, and a drain wiring line 37. Although the gate electrode 35 is of a single gate structure, a multi-gate structure may be adopted.

As shown in FIG. 1, the drain of the switching TFT is connected to the gate of the current controlling TFT. Specifically, the gate electrode 35 of the current controlling TFT 202 is electrically connected to the drain region 14 of the switching TFT 201 through the drain wiring line (may be called a connection wiring line) 23. The source wiring line 36 is connected to a current supply line 211.

Although the current controlling TFT 202 is an element for controlling the amount of current injected to an EL element 203, in view of deterioration of the EL element, it is not desirable to supply a large amount of current. Thus, in order to prevent an excessive current from flowing to the current controlling TFT 202, it is preferable to design the channel length (L) to be rather long. Desirably, it is designed so that the current becomes 0.5 to 2 μA (preferably 1 to 1.5 μA) per pixel.

Figure 9:
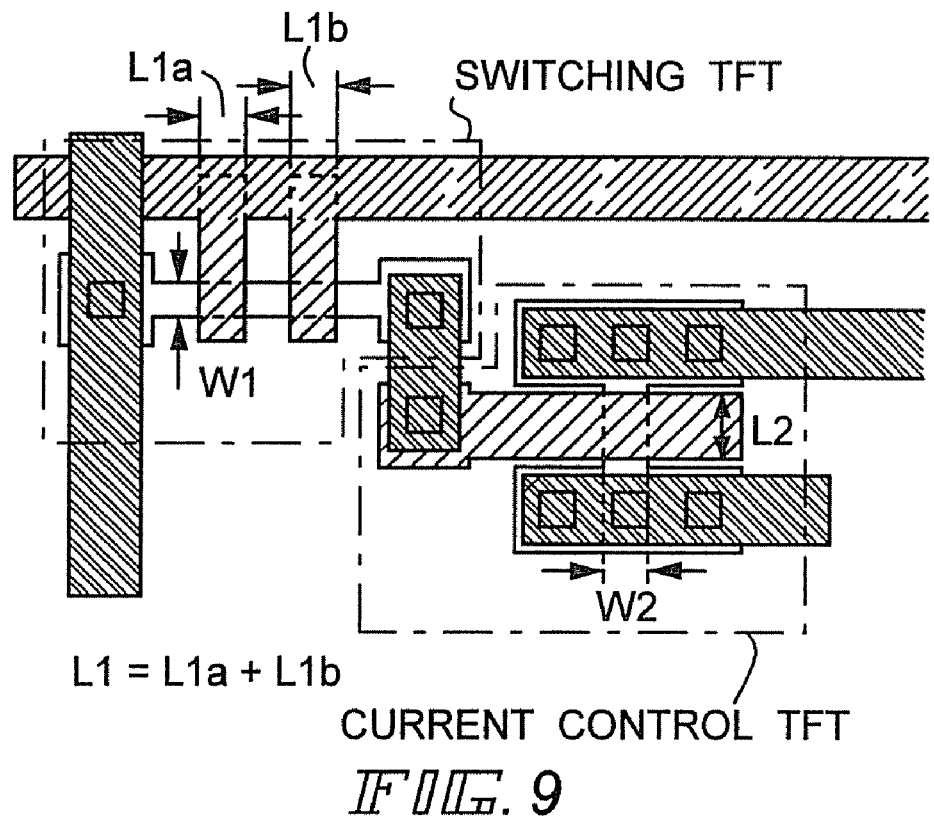
FIG. 9 is an enlarged diagram of a pixel portion of an EL display device.

In view of the above, as shown in FIG. 9, when the channel length of the switching TFT is L1 (L1=L1a+L1b), the channel width is W1, the channel length of the current controlling TFT is L2, and the channel width is W2, it is preferable that W is made 0.1 to 5 μm (typically 0.5 to 2 μm), and W2 is made 0.5 to 10 μm (typically 2 to 5 μm). Besides, it is preferable that L1 is made 0.2 to 18 μm (typically 2 to 15 μm), and L2 is made 1 to 50 μm (typically 10 to 30 μm). However, the present invention is not limited to the above numerical values.

Besides, it is appropriate that the length (width) of the LDD region formed in the switching TFT 201 is made 0.5 to 3.5 μm, typically 2.0 to 2.5 μm.

Besides, the EL display device shown in FIG. 1 is characterized also in that in the current controlling TFT 202, the LDD region 33 is provided between the drain region 32 and the channel formation region 34, and the LDD region 33 includes a region overlapping with and a region not overlapping with the gate electrode 35, with the gate insulating film 18 put between them.

The current controlling TFT 202 supplies current for causing the EL element 203 to emit light, and controls the supply amount to enable gradation display. Thus, it is necessary to take a countermeasure against deterioration due to the hot carrier injection so that deterioration does not occur even if current is supplied. When black is displayed, although the current controlling TFT 202 is turned off, at that time, if an off current value is high, clear black display becomes impossible, and the lowering of contrast or the like is caused. Thus, it is necessary to suppress the off current value as well.

With respect to the deterioration due to the hot carrier injection, it is known that the structure where the LDD region overlaps with the gate electrode is very effective. However, if the whole of the LDD region is made to overlap with the gate electrode, the off current value is increased. Thus, the present applicant contrives a new structure that the LDD region not overlapping with the gate electrode is provided in series, so that the problems of the hot carrier countermeasure and the off current value countermeasure are solved at the same time.

At this time, it is appropriate that the length of the LDD region overlapping with the gate electrode is made 0.1 to 3 μm (preferably 0.3 to 1.5 μm). If the length is too long, parasitic capacity becomes large, and if too short, the effect of preventing the hot carrier becomes weak. Besides, it is appropriate that the length of the LDD region not overlapping with the gate electrode is made 1.0 to 3.5 μm (preferably 1.5 to 2.0 μm). If the length is too long, it becomes impossible to make a sufficient current flow, and if too short, the effect of lowering the off current value becomes weak.

In the above structure, parasitic capacity is formed in the region where the gate electrode and the LDD region overlap with each other. Thus, it is preferable not to provide such region between the source region 31 and the channel formation region 34. In the current controlling TFT, since the direction of flow of carriers (here, electrons) is always the same, it is sufficient if the LDD region is provided at only the side of the drain region.

Further, looked at from the viewpoint of controlling the amount of electrical current flow, it is also effective to make the film thickness of the active layer (in particular the channel forming region) of the current control TFT 202 thinner (preferably from 20 to 50 nm, even better between 30 and 35 nm). Thus reducing the current flow value also brings about a desirable effect for the important switching TFT 201.

Next, reference numeral 41 denotes a first passivation film, and its film thickness may be from 200 to 500 nm (preferably between 300 and 400 nm). An insulating film containing silicon (a silicon nitride oxide film or a silicon nitride film is particularly preferable) can be used as the first passivation film 41 material, which also possesses a role of protecting the formed TFTs. Mobile ions such as alkaline metals are often contained in an EL layer formed last on the TFT, and the first passivation film 41 works as a protecting film so that the mobile ions do not enter the TFT side.

Furthermore, by giving the first passivation film 41a heat radiating effect, it is effective in the prevention of heat degradation of the EL layer and the TFTs. The following can be given as materials possessing the heat radiating effect: an insulating film containing at least one element selected from the group consisting of B (boron), C (carbon), and N (nitrogen), and at least one element selected from the group consisting of Al (aluminum), Si (silicon), and P (phosphorous).

For example, it is possible to use a nitride of aluminum typified by aluminum nitride (AlxNy), carbide of silicon typified by silicon carbide (SixCy), nitride of silicon typified by silicon nitride (SixNy), nitride of boron typified by boron nitride (BxNy), or phosphide of boron typified by boron phosphide (BxPy). An oxide of aluminum typified by aluminum oxide (AlxOy) has a thermal conductivity of 20 $Wm^{-1}K$, so that it can be said as one of preferable materials. These materials have not only the foregoing effects but also an effect to prevent penetration of moisture. Note that in the foregoing materials, x and y are respectively arbitrary integers.

Note that it is also possible to combine the above compound with another element. For example, it is also possible to use aluminum nitride oxide indicated by AlNxOy by adding nitrogen to the aluminum oxide. This material also has the effect to prevent penetration of moisture or alkali metal in addition to the heat radiating effect. Note that in the above aluminum nitride oxide, x and y are respectively arbitrary integers.

Besides, it is possible to use materials disclosed in Japanese Patent Application Laid-open No. Sho 62-90260. That is, it is also possible to use an insulating film containing Si, Al, N, O, or M (M is at least one kind of rare-earth element, preferably at least one element selected from Ce (cerium), Yb (ytterbium), Sm (samarium), Er (erbium), Y (yttrium), La (lantern), Gd (gadolinium), Dy (dysprosium), and Nd (neodymium)). These materials also have the effect to prevent penetration of moisture or alkali metal in addition to the heat radiating effect.

Besides, it is also possible to use a carbon film containing at least a diamond thin film or an amorphous carbon film (especially a film having characteristics close to diamond, called diamond-like carbon or the like). These have very high thermal conductivity and are very effective as a heat radiating layer.

Note that since the primary object of the first passivation film 41 is to protect the TFT against the alkali metal or the like, the film must not spoil the effect. Thus, although a thin film made of the material having the foregoing heat radiating effect can be used alone, it is effective to stack the thin film and an insulating film (typically a silicon nitride film (SixNy) or silicon nitride oxide film (SiOxNy)). Note that in the silicon nitride film or silicon nitride oxide film, x and y are respectively arbitrary integers.

A second interlayer insulating film (also referred to as a leveling film) is formed on the first passivation film 41, and leveling of a step due to the TFT is performed. It is preferable to use an organic resin film as the second interlayer insulating film 42, and materials such as polyimide, polyamide, acrylic, and BCE (benzocyclobutene) may be used. An inorganic film may also be used, of course, provided that it is capable of sufficient leveling.

Further, reference numeral 43 denotes a pixel electrode made from a material having aluminum as its main constituent (aluminum composition ratio between 50 and 99.9%), and projecting portions are formed on its surface. Reference numeral 44 denotes a cathode made from a metallic film containing an alkaline metal or an alkaline earth metal. The cathode 44 is formed so as to trace the projecting portions of the pixel electrode 43 at this point, and therefore projecting portions 45 are also formed in the surface of the cathode 44.

An aluminum film containing from 0.1 to 6.0 weight % (preferably between 0.5 and 2.0 weight %) of either silicon (Si), nickel (Ni), or copper (Cu) may be used as the pixel electrode 43.

As the cathode 44, a material having a low work function and containing magnesium (Mg), lithium (Li), or calcium (Ca) is used. Preferably, an electrode made of MgAg (material of Mg and Ag mixed at a ratio of Mg:Ag=10:1) is used. In addition, a MgAg/Al electrode, a Li/Al electrode, and a LiF/Al electrode can be enumerated.

The projecting portions 45 are explained here in detail. An expanded view of a region denoted by reference numeral 204 in FIG. 1 is shown in the blow up view of FIG. 2. As shown in FIG. 2, taking the spacing (pitch) between the projecting portions 45 as X, it is preferable to set X=0.05 to 1 µm (more preferably between 0.3 and 0.8 µm). In other words, by setting the pitch of the projecting portions 45 to be nearly equal to the wavelength of visible light, diffuse reflection (irregular reflection) of the reflected light can be made to occur effectively.

Further, when the projecting portions 45 are made into mountain shapes as shown in FIG. 2, it is preferable to set an angle θ formed by a line parallel to the substrate surface (the surface of the substrate on which the thin films are formed) and the projecting portions 45 to θ=30 to 70° (preferably between 50 and 60°).

In addition, an EL layer 46 is formed on the cathode 44 having the projecting portions 45. The EL layer 46 is formed by using known materials and structures. Namely, the EL layer may be formed by only a light emitting layer, and it also may be formed using a structure comprising a hole transporting layer and a light emitting layer, or a structure comprising a hole transporting layer, a light emitting layer, and an electron transporting layer.

Further, the EL layer 46 material may be a low molecular weight material or a high molecular weight material (polymer). However, it is effective to use a high molecular weight material which can be formed by an easy film deposition method such as spin coating.

The structure of FIG. 1 is an example of a case of using a monochromatic light emitting system where one kind of EL element corresponding to any one of RGB is formed. Although FIG. 2 shows only one pixel, a plurality of pixels having the same structure are arranged in matrix form in the pixel portion. Note that a well-known material may be adopted for the EL layer corresponding to any one of RGB.

In addition to the above system, color display can be made by using a system in which an EL element of white light emission and a color filter are combined, a system in which an EL element of blue or blue-green light emission and a fluorescent material (fluorescent color converting layer: CCM) are combined, a system in which EL elements corresponding to RGB are stacked, or the like. Of course, it is also possible to make black-and-white display by forming an EL layer of white light emission in a single layer.

An anode 47 made from a transparent conducting film and a second passivation film 48 are formed on the EL layer 46. It is possible to use a compound film of indium oxide and tin oxide (referred to as an ITO film) or a compound film of indium oxide and zinc oxide as the transparent conducting film. Tin oxide or zinc oxide may be mixed in at a ratio of 5 to 20% by weight with respect to the indium oxide. Further, the same material as the first passivation layer 41 may also be used as the second passivation layer 48.

The EL display device of this embodiment includes a pixel having a structure as in FIG. 1, and TFTs having different structures according to functions are disposed in the pixel. By this, it is possible to form a switching TFT having a sufficiently low off current value and a current controlling TFT strong against hot carrier injection in the same pixel, and it is possible to obtain the EL display device having high reliability and enabling excellent picture display (having high operation performance).

Embodiment Mode 2

Figure 16:
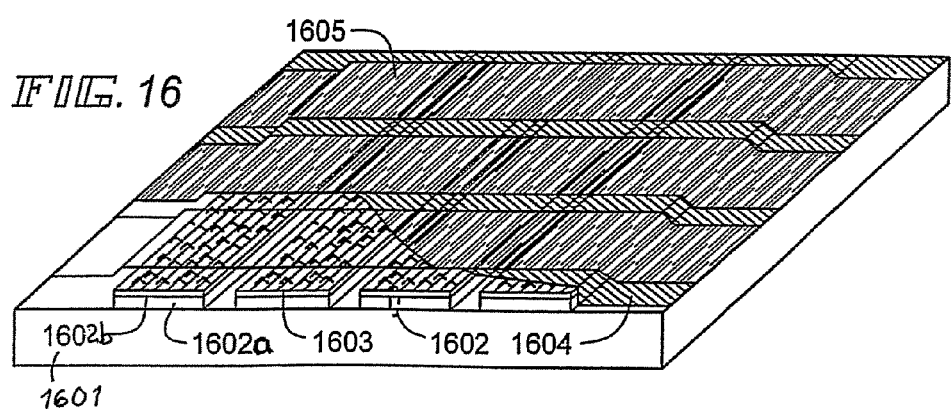
FIG. 16 is a diagram showing an external view of a simple matrix type EL display device.

An example of using the present invention in a simple matrix type EL display device is shown in FIG. 16 in embodiment mode 2. In FIG. 16, reference numeral 1601 denotes a substrate, reference numerals 1602*a* denote aluminum films with added silicon, and 1602*b* are cathodes made from lithium fluoride films formed in succession on the aluminum films 1602*a*. Electrodes 1602 composed of these films in lamination are formed aligned in a stripe shape. The electrodes 1602 are referred to as first electrodes here.

In embodiment mode 2, the aluminum films 1602*a* are deposited so as to have projecting portions formed in their surfaces due to steps at the time of film deposition, and projecting portions 1603 are formed in the surface of the lithium fluoride film cathodes 1602*b* along the projecting portions formed in the base film aluminum films 1602*a*.

An EL layer 1604 is formed by a low molecular weight organic material or a high molecular weight organic material on the electrodes 1602, and a plurality of anodes 1605 made from transparent conducting films are formed on the EL layer 1604. The anodes 1605 are formed perpendicular with respect to the first electrodes 1602, and are formed aligned in a stripe pattern. The electrodes 1605 are referred to as second electrodes here.

A matrix is thus formed by the first electrodes 1602 and the second electrodes 1605, and EL elements are formed at intersecting portions by the first electrodes (cathodes), the EL layer, and the second electrodes (anodes). A predetermined voltage is then applied to the first electrodes 1602 and the second electrodes 1605, and the EL layer 1604 is made to emit light.

In portions which do not emit light, the surface of the cathodes 1602*b* is visible at this point, but external light is reflected diffusely (irregularly) by the projecting portions 1603, and therefore the face of an observer and scenery is not reflected. In other words, it is not necessary to use an elliptical film or the like, and therefore it is possible to reduce the manufacturing cost of the EL display device.

Embodiment 1

The embodiments of the present invention are explained using FIGS. 4A to 6C. A method of simultaneous manufacture of a pixel portion, and TFTs of a driver circuit portion formed in the periphery of the pixel portion, is explained here. Note that in order to simplify the explanation, a CMOS circuit is shown as a basic circuit for the driver circuits.

First, as shown in FIG. 4A, a base film 301 is formed with a 300 nm thickness on a glass substrate 300. Oxidized silicon nitride films are laminated as the base film 301 in embodiment 1. It is good to set the nitrogen concentration at between 10 and 25 wt % in the film contacting the glass substrate 300.

Besides, as a part of the under film 301 it is effective to provide an insulating film made of a material similar to the first passivation film 41 shown in FIG. 2. The current controlling TFT is apt to generate heat since a large current is made to flow, and it is effective to provide an insulating film having a heat radiating effect at a place as close as possible.

Next, an amorphous silicon film (not shown in the figures) is formed with a thickness of 50 nm on the base film 301 by a known deposition method. Note that it is not necessary to limit this to the amorphous silicon film, and another film may be formed provided that it is a semiconductor film containing an amorphous structure (including a microcrystalline semiconductor film). In addition, a compound semiconductor film containing an amorphous structure, such as an amorphous silicon germanium film, may also be used. Further, the film thickness may be made from 20 to 100 nm.

The amorphous silicon film is then crystallized by a known method, forming a crystalline silicon film (also referred to as a polycrystalline silicon film or a polysilicon film) 302. Thermal crystallization using an electric furnace, laser annealing crystallization using a laser, and lamp annealing crystallization using an infrared lamp exist as known crystallization methods. Crystallization is performed in embodiment 1 using light from an excimer laser which uses XeCl gas.

Note that pulse emission type excimer laser light formed into a linear shape is used in embodiment 1, but a rectangular shape may also be used, and continuous emission argon laser light and continuous emission excimer laser light can also be used.

In this embodiment, although the crystalline silicon film is used as the active layer of the TFT, it is also possible to use an amorphous silicon film. However, in order to increase an opening rate of a pixel by making an area of the current controlling TFT as small as possible, it is advantageous to use the crystalline silicon film through which a current can easily flow.

Note that it is effective to form the active layer of the switching TFT, in which there is a necessity to reduce the off current, by the amorphous silicon film, and to form the active layer of the current control TFT by the crystalline silicon film. Electric current flows with difficulty in the amorphous silicon film because the carrier mobility is low, and the off current does not easily flow. In other words, the most can be made of the advantages of both the amorphous silicon film, through which current does not flow easily, and the crystalline silicon film, through which current easily flows.

Next, as shown in FIG. 4B, a protecting film 303 is formed on the crystalline silicon film 302 with a silicon oxide film having a thickness of 130 nm. This thickness may be chosen within the range of 100 to 200 nm (preferably between 130 and 170 nm). Furthermore, other films may also be used providing that they are insulating films containing silicon. The protecting film 303 is formed so that the crystalline silicon film is not directly exposed to plasma during addition of an impurity, and so that it is possible to have delicate concentration control of the impurity.

Resist masks 304a and 304b are then formed on the protecting film 303, and an impurity element which imparts n-type conductivity (hereafter referred to as an n-type impurity element) is added. Note that elements residing in periodic table group 15 are generally used as the n-type impurity element, and typically phosphorus or arsenic can be used.

Note that a plasma doping method is used, in which phosphine ($PH_3$) is plasma activated without separation of mass, and phosphorus is added at a concentration of $1 \times 10^{18}$ atoms/cm$^3$ in embodiment 1. An ion implantation method, in which separation of mass is performed, may also be used, of course.

The dose amount is regulated so that the n-type impurity element is contained in n-type impurity regions 305 and 306, thus formed by this process, at a concentration of $2 \times 10^{16}$ to $5 \times 10^{19}$ atoms/cm$^3$ (typically between $5 \times 10^{17}$ and $5 \times 10^{18}$ atoms/cm$^3$).

Next, as shown in FIG. 4C, the protecting film 303 is removed, and an activation of the added periodic table group 15 elements is performed. A known technique of activation may be used as the means of activation, and activation is done in embodiment 1 by irradiation of excimer laser light. A pulse emission type excimer laser and a continuous emission type excimer laser may both, of course, be used, and it is not necessary to place any limits on the use of excimer laser light. The goal is the activation of the added impurity element, and it is preferable that irradiation is performed at an energy level at which the crystalline silicon film does not melt. Note that the laser irradiation may also be performed with the protecting film 303 in place.

The activation by heat treatment may also be performed along with activation of the impurity element by laser light. When activation is performed by heat treatment, considering the heat resistance of the substrate, it is good to perform heat treatment on the order of 450 to 550° C.

Boundary portions of the n-type impurity regions 305 and 306, that is, boundary portions (connecting portions) thereof with regions which are present in the periphery of the n-type impurity regions 305 and 306 and are not added with the n-type impurity are delineated by this process. This means that, at the point when the TFTs are later completed, extremely good connections can be formed between LDD regions and channel forming regions.

Figure 4D:
Figure 4D:
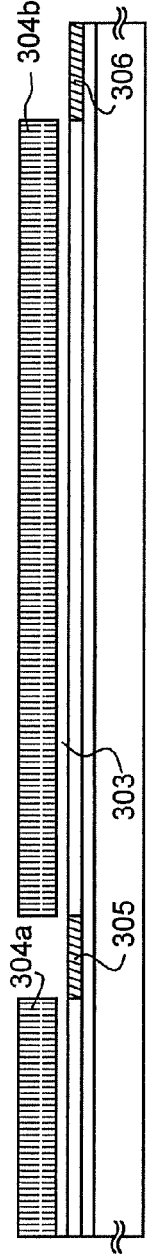
Figure 4D:
Figure 4D:
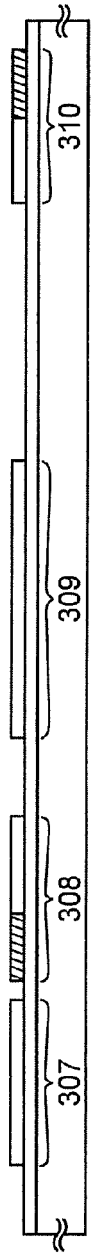

Unnecessary portions of the crystalline silicon film are removed next, as shown in FIG. 4D, and island shape semiconductor films (hereafter referred to as active layers) 307 to 310 are formed.

Figure 4E:
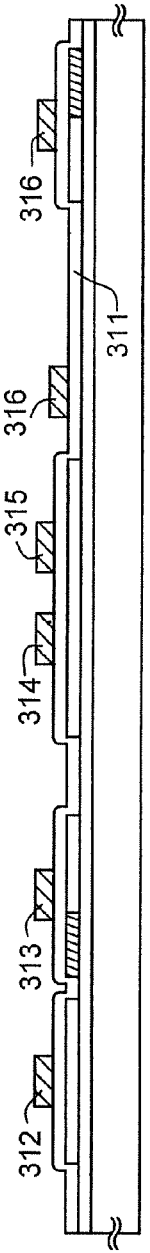
Figure 5D:
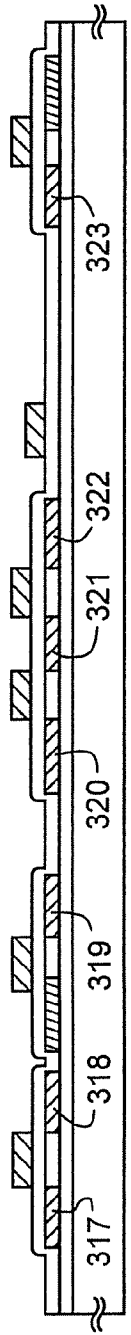
Figure 5D:
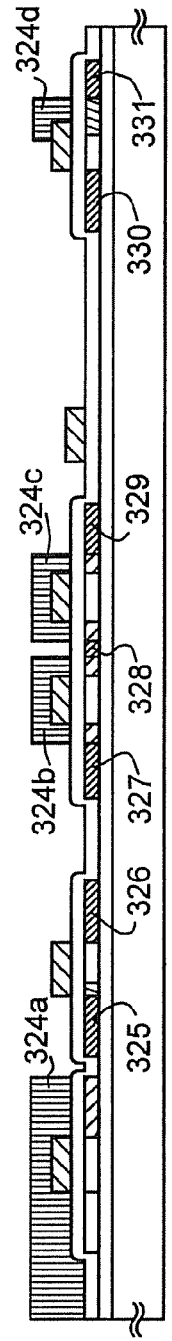
Figure 5D:
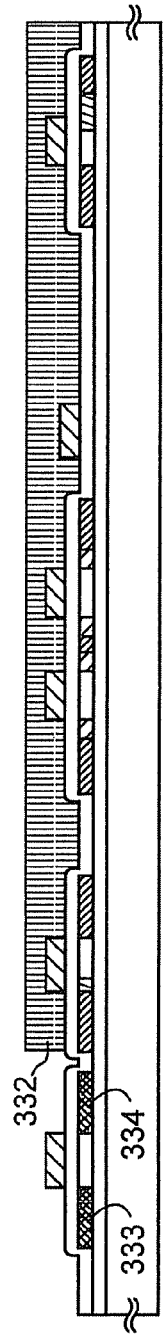
Figure 5D:
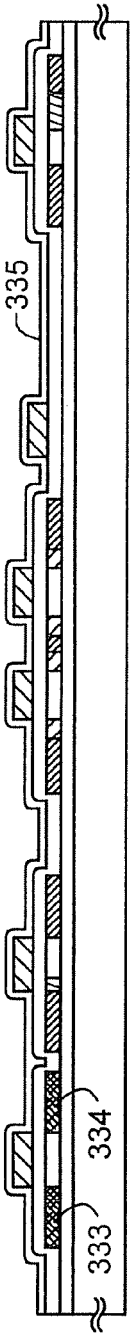

Then, as shown in FIG. 4E, a gate insulating film 311 is formed, covering the active layers 307 to 310. An insulating film containing silicon and with a thickness of 10 to 200 nm, preferably between 50 and 150 nm, may be used as the gate insulating film 311. A single layer structure or a lamination structure may be used. A 110 nm thick oxidized silicon nitride film is used in embodiment 1.

A conducting film is formed next with a thickness of 200 to 400 nm, and is patterned, forming gate electrodes 312 to 316. Single layer conducting films may be formed for the gate electrodes 312 to 316, and when necessary, it is preferable to form a lamination film such of two layers or three layers. All known conducting films can be used as the gate electrode material.

Typically, it is possible to use a film made of an element selected from tantalum (Ta), titanium (Ti), molybdenum (Mo), tungsten (W), chromium (Cr), and silicon (Si), a film of nitride of the above element (typically a tantalum nitride film, tungsten nitride film, or titanium nitride film), an alloy film of combination of the above elements (typically Mo—W alloy, Mo—Ta alloy), or a silicide film of the above element (typically a tungsten silicide film, titanium silicide film). Of course, the films may be used as a single layer or a laminate layer.

In this embodiment, a laminate film of a tungsten nitride (WN) film having a thickness of 50 nm and a tungsten (W) film having a thickness of 350 nm is used. These may be formed by a sputtering method. When an inert gas of Xe, Ne or the like is added as a sputtering gas, film peeling due to stress can be prevented.

The gate electrodes 313 and 316 are formed at this time so as to overlap a portion of the n-type impurity regions 305 and 306, respectively, sandwiching the gate insulating film 311. This overlapping portion later becomes an LDD region overlapping the gate electrode.

Next, an n-type impurity element (phosphorous is used in embodiment 1) is added in a self-aligning manner with the gate electrodes 312 to 316 as masks, as shown in FIG. 5A. The addition is regulated so that phosphorus is added to impurity regions 317 to 323 thus formed at a concentration of $\frac{1}{10}$ to $\frac{1}{2}$ that of the impurity regions 305 and 306 (typically between $\frac{1}{4}$ and $\frac{1}{3}$). Specifically, a concentration of $1\times10^{16}$ to $5\times10^{18}$ atoms/cm$^3$ (typically $3\times10^{17}$ to $3\times10^{18}$ atoms/cm$^3$) is preferable.

Resist masks 324a to 324d are formed next, with a shape covering the gate electrodes etc., as shown in FIG. 5B, and an n-type impurity element (phosphorus is used in embodiment 1) is added, forming impurity regions 325 to 331 containing a high concentration of phosphorus. Ion doping using phosphine (PH$_3$) is also performed here, and is regulated so that the phosphorus concentration of these regions is from $1\times10^{20}$ to $1\times10^{21}$ atoms/cm$^3$ (typically between $2\times10^{20}$ and $5\times10^{21}$ atoms/cm$^3$).

A source region or a drain region of the n-channel TFT is formed by this process, and in the switching TFT, a portion of the n-type impurity regions 320 to 322 formed by the process of FIG. 5A remains. These remaining regions correspond to the LDD regions 15a to 15d of the switching TFT in FIG. 1.

Next, as shown in FIG. 5C, the resist masks 324a to 324d are removed, and a new resist mask 332 is formed. A p-type impurity element (boron is used in embodiment 1) is then added, forming impurity regions 333 and 334 containing a high concentration of boron. Boron is added here to form impurity regions 333 and 334 at a concentration of $3\times10^{20}$ to $3\times10^{21}$ atoms/cm$^3$ (typically between $5\times10^{20}$ and $1\times10^{21}$ atoms/cm$^3$) by ion doping using diborane (B$_2$H$_6$).

Note that phosphorus has already been added to the impurity regions 333 and 334 at a concentration of $1\times10^{20}$ to $1\times10^{21}$ atoms/cm$^3$, but boron is added here at a concentration of at least 3 times of the phosphorus. Therefore, the n-type impurity regions already formed completely invert to p-type, and function as p-type impurity regions.

Next, after removing the resist mask 332, an insulating film (protecting film) 335 used for protecting the gate is formed. The insulating film 335 is formed in order to prevent an increase in resistance value of the gate electrode due to oxidation during the heat treatment which is performed next. A 50 to 300 nm (preferably between 100 and 200 nm) thick insulating film containing silicon may be formed as the insulating film 335. (See FIG. 5D.)

The n-type and p-type impurity elements added to the active layer at various concentrations are activated next. Furnace annealing, laser annealing, lamp annealing, or a combination of these processes can be used as a means of activation. In embodiment 1, heat treatment (furnace annealing) is performed for 4 hours at 550° C. in a nitrogen atmosphere in an electric furnace.

Figure 6A:
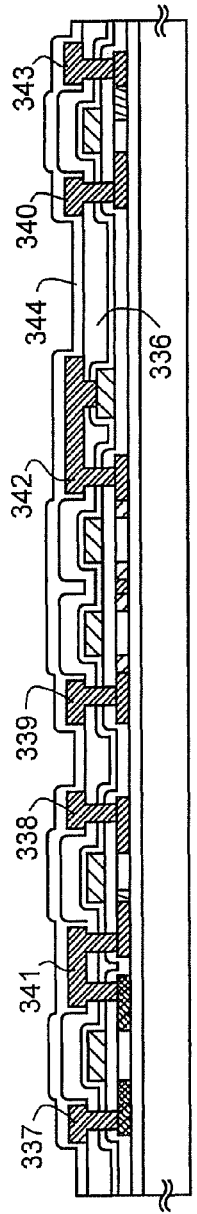
FIGS. 6A to 6C are diagrams showing the process of manufacturing the active matrix type EL display device.

A first interlayer insulating film 336 is formed next, as shown in FIG. 6A. A single layer insulating film containing silicon is used as the first interlayer insulating film 336, while a lamination film may be combined inbetween. Further, a film thickness of between 400 nm and 1.5 μm may be used. A lamination structure of an 800 nm thick silicon oxide film on a 200 nm thick oxidized silicon nitride film is used in embodiment 1.

In addition, heat treatment is performed for 1 to 12 hours at 300 to 450° C. in an environment containing between 3 and 100% hydrogen, performing hydrogenation. This process is one of hydrogen termination of dangling bonds in the semiconductor film by hydrogen which is thermally activated. Plasma hydrogenation (using hydrogen activated by a plasma) may also be performed as another means of hydrogenation.

Note that the hydrogenation step may also be inserted during the formation of the first interlayer insulating film 336. Namely, hydrogen processing may be performed as above after forming the 200 nm thick oxidized silicon nitride film, and then the remaining 800 nm thick silicon oxide film may be formed.

Next, a contact hole is formed in the first interlayer insulating film 336, and source wiring lines 337 to 340 and drain wiring lines 341 to 343 are formed. In this embodiment, this electrode is made of a laminate film of three-layer structure in which a titanium film having a thickness of 100 nm, an aluminum film containing titanium and having a thickness of 300 nm, and a titanium film having a thickness of 150 nm are continuously formed by a sputtering method. Of course, other conductive films may be used.

A first passivation film 344 is formed next with a thickness of 50 to 500 nm (typically between 200 and 300 nm). A 300 nm thick oxidized silicon nitride film is used as the first passivation film 344 in embodiment 1. This may also be substituted by a silicon nitride film. It is of course possible to use the same materials as those of the first passivation film 41 of FIG. 1.

Note that it is effective to perform plasma processing using a gas containing hydrogen such as H$_2$ or NH$_3$ etc. before the formation of the oxidized silicon nitride film. Hydrogen activated by this preprocess is supplied to the first interlayer insulating film 336, and the film quality of the first passivation film 344 is improved by performing heat treatment. At the same time, the hydrogen added to the first interlayer insulating film 336 diffuses to the lower side, and the active layers can be hydrogenated effectively.

Figure 6B:
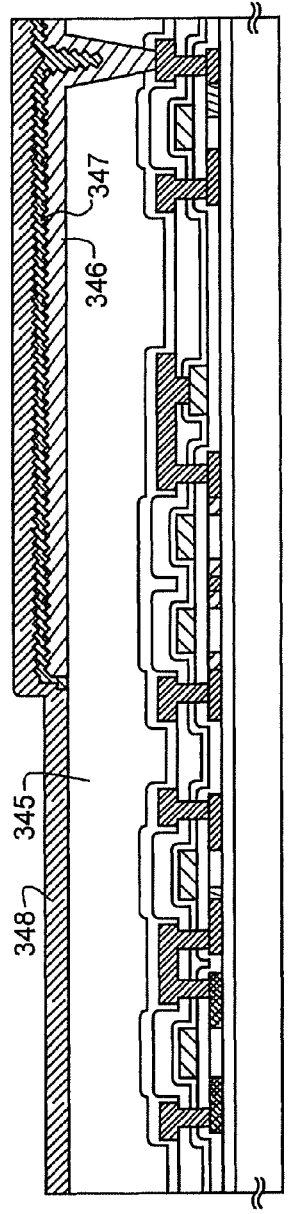

Next, as shown in FIG. 6B, a second interlayer insulating film 345 made of organic resin is formed. As the organic resin, it is possible to use polyimide, polyamide, acryl, BCB (benzocyclobutene) or the like. Especially, since the second interlayer insulating film 345 is primarily used for flattening, acryl excellent in flattening properties is preferable. In this embodiment, an acrylic film is formed to a thickness sufficient to flatten a stepped portion formed by TFTs. It is appropriate that the thickness is preferably made 1 to 5 μm (more preferably 2 to 4 μm).

Next, the second interlayer insulating film 345 and the first passivation film 344 are etched, forming a contact hole which reaches the drain wiring 343, and a pixel electrode 346 is formed. An aluminum film containing 1 wt % Si is used as the pixel electrode 346 in embodiment 1. An aluminum film having projecting portions in its surface is formed by depositing the aluminum film by sputtering at a substrate temperature of 50 to 200° C. (preferably between 70 and 150° C.). Note that between 0.1 and 5% moisture may also be added to the sputtering gas.

The pixel electrode 346 having projecting portions in its surface can thus be formed. The pattern of projecting portions formed is irregular in this case, but the aim is diffuse reflection (irregular reflection) of light, and therefore irregularity does not become a problem in particular.

If it is necessary to form regular projecting portions, then the surface of the pixel electrode is patterned and then the projecting portions are formed, or a means of performing patterning the surface of the second interlayer insulating film 345, forming the projecting portions, and then forming the pixel electrode on the projecting portions may be employed. Further, when using a material capable of selective etching by utilizing orienting characteristics as the pixel electrode 346 material, the projecting portions can easily be obtained by performing surface processing by using an etchant so as to expose a specifically oriented surface. Techniques such as a technique of pit formation of a silicon surface are known as typical techniques of selective etching.

A cathode 347 made from a MgAg electrode is formed next with a thickness of 120 nm. The film thickness may be from 80 to 200 nm (typically between 100 and 150 nm). Further, as shown in embodiment mode 1, a LiF/Al electrode (a lamination film of a lithium fluoride film and an aluminum film) may also be used. In any case, it is preferable to use a material having a small work function.

The cathode 347 is formed along the projecting portions formed in the surface of the pixel electrode 346 at this time, and therefore the cathode 347 is also formed having projecting portions in its surface. The problem of an observer's face being reflected in the display portion, as shown in the conventional example, is a problem of reflection on the cathode surface, and by forming the projecting portions in the cathode surface and generating diffuse reflection (irregular reflection), this type of inconvenience can be prevented.

An EL layer 348 is formed next by evaporation. A two layer structure of a hole transporting layer and an emitting layer is used as the EL layer in embodiment 1 (shown as a single layer in the drawings), but there are also cases of forming a hole injecting layer, an electron injecting layer, or an electron transporting layer. Many examples of this type of combination have already been reported upon, and any of these constitutions may also be used.

Furthermore, moisture adhering to the interface of the EL layer 348 and the cathode 347, particularly oxygen, must be avoided completely. This is because the EL layer 348 oxidizes easily and deteriorates. The cathode 347 and the EL layer 348 are therefore formed successively by using evaporation without breaking the vacuum. Specifically, a tris-(8-quinolinolate) aluminum (referred to as Alq) is formed first with a thickness of 50 nm as the emitting layer, and a 70 nm thick TPD (triphenylamine derivative) is formed on the emitting layer as the hole transporting layer. The two layer structure EL layer 348 is thus formed.

Note that an example of forming the EL layer using low molecular weight organic materials is shown in embodiment 1, but high molecular weight organic materials may also be used, and a combination of both may also be used. Further, any known structure (a single layer structure or a lamination structure) may also be used as the EL layer structure.

The structure of FIG. 6B is thus obtained. The EL layer 348 is exposed in this state, and therefore it is important to place the substrate in an atmosphere filled by an inert gas such as nitrogen or a noble gas. The substrate is then conveyed to a sputtering apparatus without exposure to the atmosphere, and anodes 349 are formed from a transparent conducting film. The film thickness may be set from 100 to 200 nm.

Generally known materials such as ITO (an indium oxide and tin oxide compound) or an indium oxide and zinc oxide compound can be used as the transparent conducting film. Potassium may also be added to the indium oxide and zinc oxide compound.

In addition, a second passivation film 350 made from an insulating film containing silicon is formed on the anodes 349 in embodiment 1. The second passivation film 350 is also preferably formed in succession without breaking the vacuum. A 300 nm thick silicon nitride film is formed as the second passivation film 350 in embodiment 1.

Figure 6C:
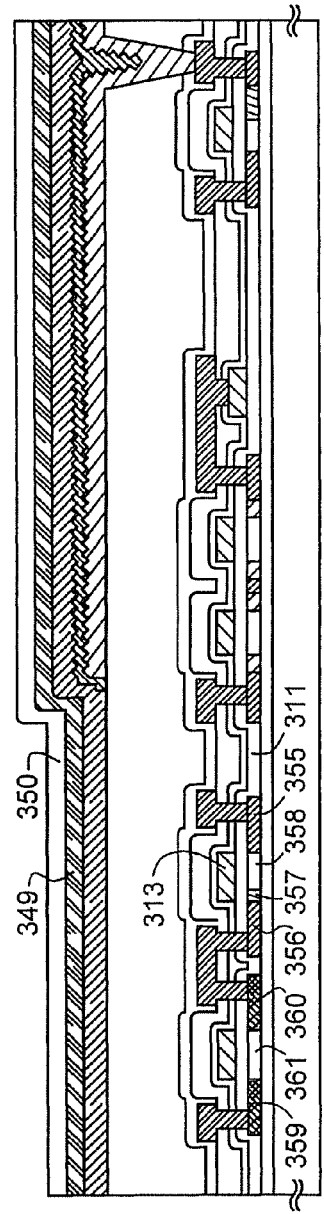

In this way, an active matrix type EL display device having a structure as shown in FIG. 6C is completed. In the active matrix type EL display device of this embodiment, a TFT having an optimum structure is disposed in not only the pixel portion but also the driving circuit portion, so that very high reliability is obtained and operation characteristics can also be improved.

First, a TFT having a structure to decrease hot carrier injection so as not to drop the operation speed thereof as much as possible is used as an n-channel TFT 205 of a CMOS circuit forming a driving circuit. Note that the driving circuit here includes a shift register, a buffer, a level shifter, a sampling circuit (sample and hold circuit) and the like. In the case where digital driving is made, a signal conversion circuit such as a D/A converter can also be included.

In the case of this embodiment, as shown in FIG. 6C, the active layer of the n-channel 205 includes a source region 355, a drain region 356, an LDD region 357 and a channel formation region 358, and the LDD region 357 overlaps with the gate electrode 313, putting the gate insulating film 311 therebetween.

Consideration not to drop the operation speed is the reason why the LDD region is formed at only the drain region side. In this n-channel TFT 205, it is not necessary to pay attention to an off current value very much, rather, it is better to give importance to an operation speed. Thus, it is desirable that the LDO region 357 is made to completely overlap with the gate electrode to decrease a resistance component to a minimum. That is, it is preferable to remove the so-called offset.

Further, an active layer of a p-channel TFT 206 of a CMOS circuit includes a source region 359, a drain region 360, and a channel forming region 361, and an LDD region is not formed in particular. Deterioration due to hot carrier injection does not become much of a problem for the p-channel TFT even with this structure, but it is also possible to make a countermeasure against hot carriers by forming an LDD region similar to that of the n-channel TFT 205.

Note that, among the driving circuits, the sampling circuit is somewhat unique compared to the other sampling circuits, in that a large electric current flows in both directions in the channel forming region. Namely, the roles of the source region and the drain region are interchanged. In addition, it is necessary to control the value of the off current to be as small as possible, and with that in mind, it is preferable to use a TFT having functions which are on an intermediate level between the switching TFT and the current control TFT in the sampling circuit. A combination of an n-channel TFT 207 and a p-channel TFT 208 as shown in FIG. 10 is used as the sampling circuit in embodiment 1.

Figure 10:
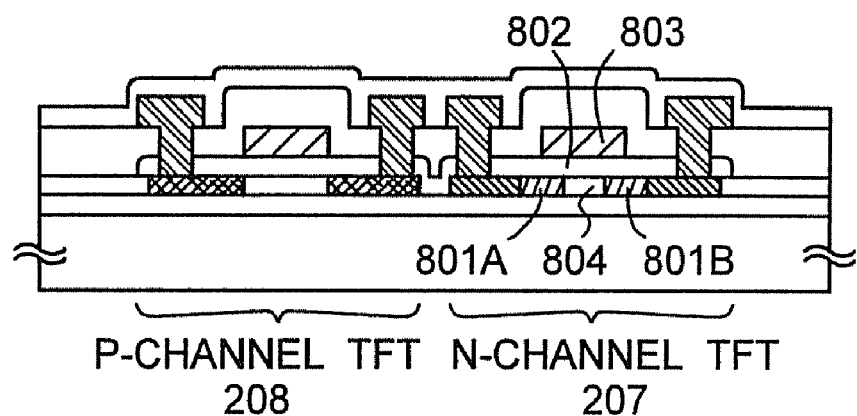
FIG. 10 is a diagram showing the element structure of a sampling circuit of an EL display device.

A portion of LDD regions 801*a* and 801*b* overlap a gate electrode 803 through a gate insulating film 802, as shown in FIG. 10, in the n-channel TFT 207 which forms the sampling circuit. This effect is the same as that stated by the explanation of the current control TFT 202, and for the case of the sampling circuit, the fact that the LDD regions 801*a* and 801*b* are formed with a shape sandwiching a channel forming region 804 is a point of difference.

Actually, when the state of FIG. 6C is completed, it is preferable to make packaging (sealing) by a housing member such as a protection film having high airtightness and less degassing (laminate film, ultraviolet ray curing resin film, etc.) or a sealing material so as to prevent exposure to the outer air. At that time, when the inside of the sealing member is made an inert gas atmosphere, or a moisture absorbent (for example, barium oxide) is disposed in the inside, the reliability (lifetime) of the EL layer is improved.

After the airtightness is raised by processing such as packaging, a connector (flexible print circuit: FPC) for connecting a terminal extended from the element or circuit formed on the substrate to an external signal terminal is attached so that a product is completed. In the present specification, the EL display device, which is made to have such a state that it can be shipped, is called an EL module.

Here, the structure of the active matrix type EL display device of this embodiment will be described with reference to a perspective view of FIG. 7. The active matrix type EL display device of this embodiment is constituted by a pixel portion 602, a gate side driving circuit 603, and a source side driving circuit 604 formed on a glass substrate 601. A switching TFT 605 of a pixel portion is an n-channel TFT, and is disposed at an intersection point of a gate wiring line 606 connected to the gate side driving circuit 603 and a source wiring line 607 connected to the source side driving circuit 604. The drain of the switching TFT 605 is connected to the gate of a current controlling TFT 608.

In addition, the source side of the current control TFT 608 is connected to a power supply line 609. With the structure of this embodiment, the power supply line 609 is connected to the current control TFT 608, and a drain of the current control TFT 608 is connected to an EL element 610.

If the current control TFT 608 is an n-channel TFT, then a cathode of the EL element 610 is electrically connected to the drain. Further, for a case of using a p-channel TFT for the current control TFT 608, an anode of the EL element 610 is electrically connected to the drain.

Input wiring lines (connection wiring lines) 612 and 613 for transmitting signals to the driving circuits and an input wiring line 614 connected to the current supply line 609 are provided in an FPC 611 as an external input-output terminal.

Figure 7:
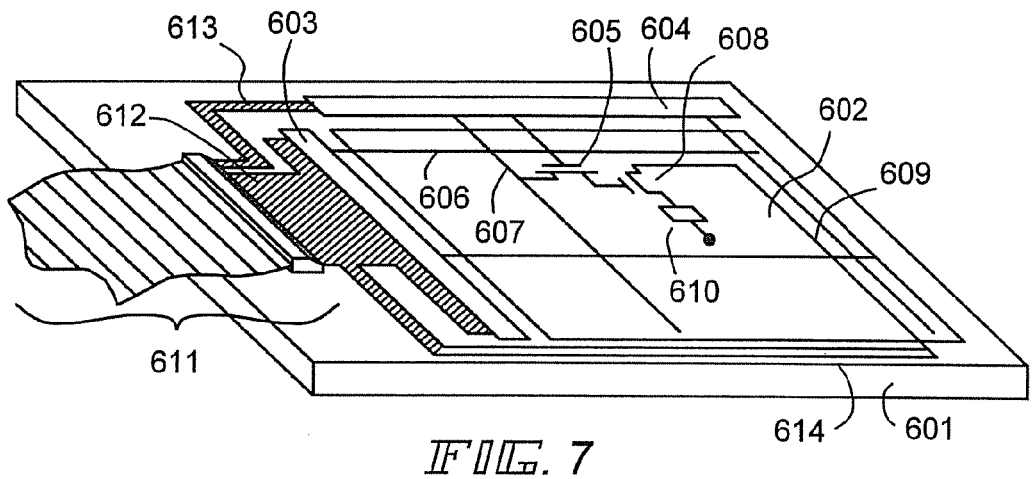
FIG. 7 is a diagram showing an external view of an EL module.
Figure 8:
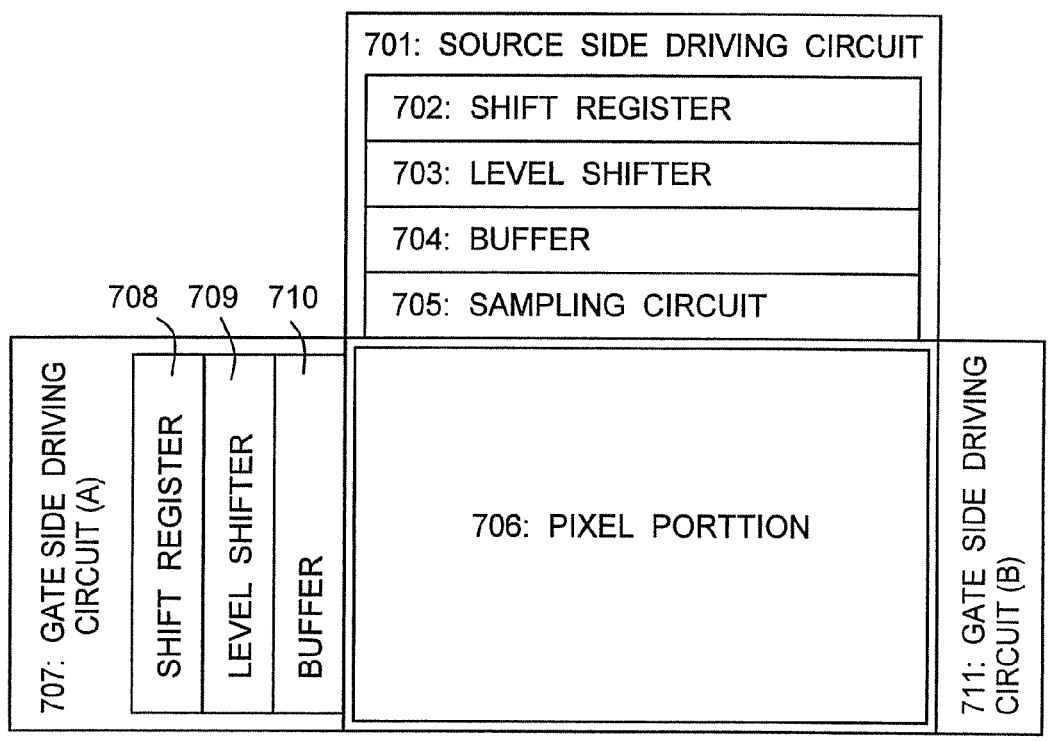
FIG. 8 is a diagram showing a circuit block structure of an EL display device.

An example of circuit structure of the EL display device shown in FIG. 7 is shown in FIG. 8. The EL display device of this embodiment includes a source side driving circuit 701, a gate side driving circuit (A) 707, a gate side driving circuit (B) 711, and a pixel portion 706. Note that in the present specification, the term driving circuit is a general term including the source side driving circuit and the gate side driving circuit.

The source side driving circuit 701 is provided with a shift register 702, a level shifter 703, a buffer 704, and a sampling circuit (sample and hold circuit) 705. The gate side driving circuit (A) 707 is provided with a shift register 708, a level shifter 709, and a buffer 710. The gate side driving circuit (B) 711 also has the same structure.

Here, the shift registers 702 and 708 have driving voltages of 5 to 16V (typically 10 V) respectively, and the structure indicated by 205 in FIG. 6C is suitable for an n-channel TFT used in a CMOS circuit forming the circuit.

Besides, for each of the level shifters 703 and 709 and the buffers 704 and 710, similarly to the shift register, the CMOS circuit including the n-channel TFT 205 of FIG. 6C is suitable. Note that it is effective to make a gate wiring line a multi-gate structure such as a double gate structure or a triple gate structure in improving of reliability of each circuit.

Besides, since the source region and drain region are inverted and it is necessary to decrease an off current value, a CMOS circuit including the n-channel TFT 207 of FIG. 10 is suitable for the sampling circuit 705.

In the pixel portion 706 are disposed pixels having the structure shown in FIG. 1.

The foregoing structure can be easily realized by manufacturing TFTs in accordance with the manufacturing steps shown in FIGS. 4 to 6. In this embodiment, although only the structure of the pixel portion and the driving circuit is shown, if the manufacturing steps of this embodiment are used, it is possible to form a logical circuit other than the driving circuit, such as a signal dividing circuit, a D/A converter circuit, an operational amplifier circuit, γ-correction circuit, or the like on the same substrate, and further, it is believed that a memory portion, a microprocessor, or the like can be formed.

Further, an EL module of this embodiment including a housing member as well will be described with reference to FIGS. 11A and 11B. Note that as necessary, reference numbers used in FIGS. 7 and 8 will be quoted.

A pixel portion 1101, a source side driving circuit 1102, and a gate side driving circuit 1103 are formed on a substrate (including an under film below a TFT) 1100. Various wiring lines from the respective driving circuits lead to an FPC 611 through input-output wiring lines 612 to 614 and are connected to an external equipment.

A sealing material 1104 is formed at this time so as to surround at least the pixel portion, and preferably the driver circuits and the pixel portion. Note that a plate shape material possessing a concave portion so as to surround the element portion may also be used as the sealing material 1104, and that a sheet shape ultraviolet hardened resin may also be used. When using a metallic plate possessing a concave portion so as to surround the element portion as the sealing material 1104, the sealing material 1104 is fixed to the substrate 1100 by an adhesive 1105, forming an airtight space between the sealing material 1104 and the substrate 1100. The EL element is in a state of being completely enclosed in the airtight space at this point, and is completely cutoff from the atmosphere.

A plate shape material such as amorphous glass (such as borosilicate glass and quartz), crystallized glass, and ceramic glass can be used as the sealing material 1104, and an organic resin (such as an acrylic resin, a styrene resin, a polycarbonate resin, or an epoxy resin) and a silicone resin can also be used. Whichever is used, the sealing material 1104 must be transparent when manufacturing an EL display device type having a substrate which outputs light in the reflection side, as in embodiment 1.

As a material of the adhesive 1105, an adhesive of epoxy resin, acrylate resin, or the like can be used. Further, thermosetting resin or photo-curing resin can also be used as the adhesive. However, it is necessary to use such material as to block penetration of oxygen and moisture to the utmost.

In addition, a gap 1106 between the sealing material and the substrate 1100 is preferably filled with an inert gas (such as argon, helium, or nitrogen). Further, this is not limited to a gas, and it is also possible to use a transparent inert liquid. It is also effective to form a drying agent in the gap 1106. Materials such as those disclosed in Japanese Patent Application Laid-open No. 9-148066 can be used as the drying agent. Barium oxide may typically be used.

Figure 11:
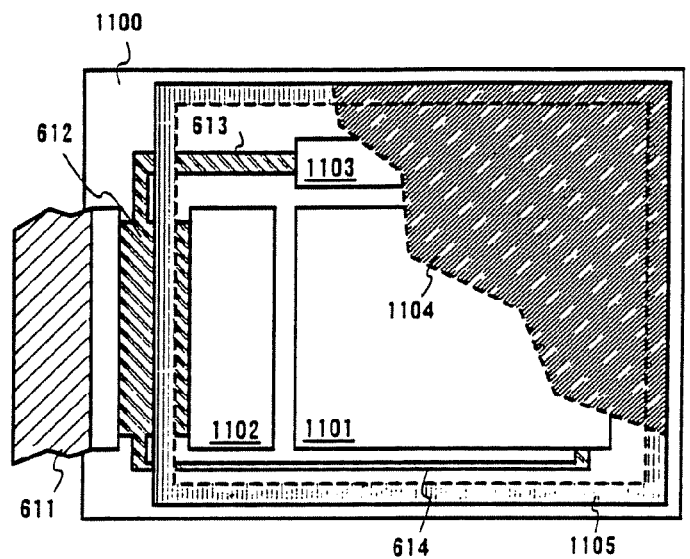
FIGS. 11A and 11B are diagrams showing external views of an EL module.
Figure 11:
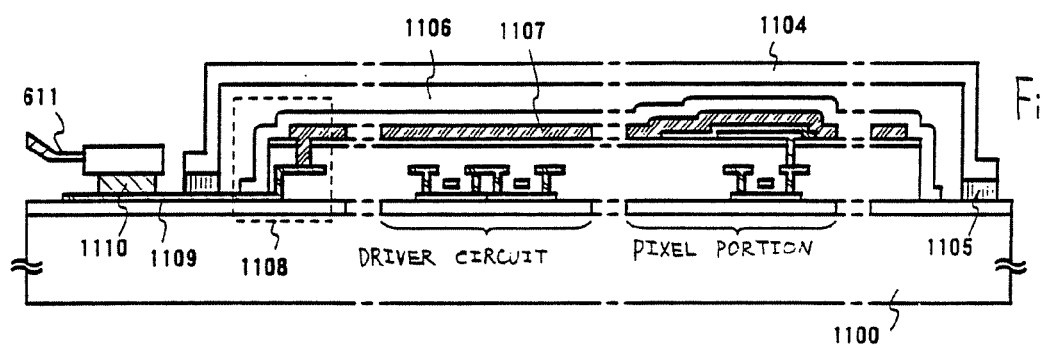

Furthermore, a plurality of pixels are formed in the pixel region having the respective isolated EL elements, as shown in FIG. 11, and all of them have an anode 1107 as a common electrode. The cathodes and the EL layer may be formed only in the pixel portion at this point; it is not necessary to form them on the driver circuits. Of course, there is no problem in forming them on the driver circuits, but considering that alkaline metals are included in the EL layer, it is preferable to not form them on the driver circuits. Note that the EL layer is weak with respect to moisture and cannot be patterned, and therefore it may be formed selectively by evaporation using a shadow mask.

Note also that the anode 1107 is connected to an input-output wiring 1109 in a region denoted by reference numeral 1108. The input-output wiring 1109 is a power supply line for imparting a fixed voltage (a ground voltage, specifically 0 V, in embodiment 1) to the anode 1107, and it is electrically connected to an FPC 611 through a conducting paste material 1110.

Figure 12A:
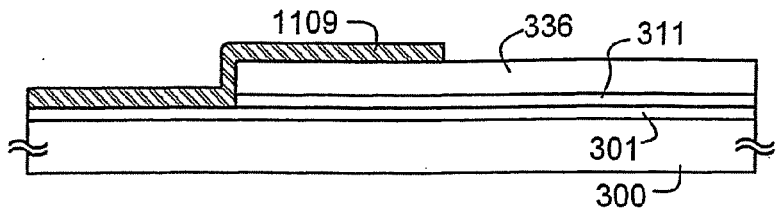
FIGS. 12A to 12C are diagrams showing a process of manufacturing a contact structure.
Figure 12B:
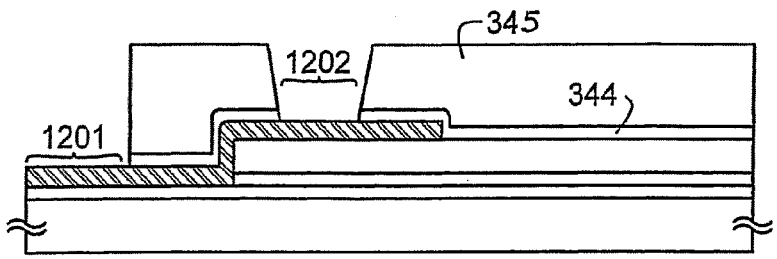
Figure 12C:
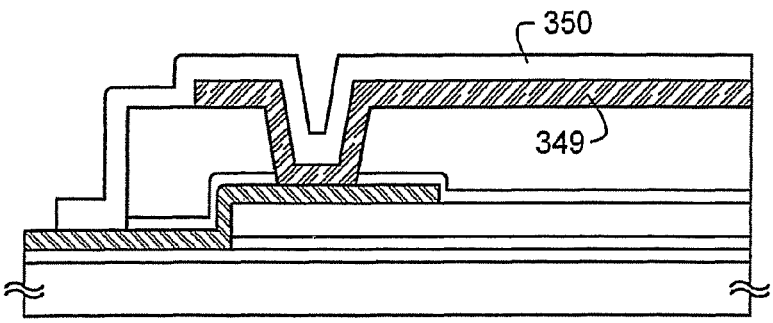

A manufacturing process for realizing a contact structure in the region 1108 is explained here using FIGS. 12A to 12C.

First, in accordance with the steps of this embodiment, the state of FIG. 6A is obtained. At this time, at an end portion of the substrate (region indicated by 1108 in FIG. 11B), the first interlayer insulating film 336 and the gate insulating film 311 are removed, and an input-output wiring line 1109 is formed thereon. Of course, it is formed at the same time as the source wiring line and the drain wiring line of FIG. 6A (FIG. 12A).

Next, when etching the second interlayer insulating film 345 and the first passivation film 344 in FIG. 6B, a region denoted by reference numeral 1201 is removed, and an opening portion 1202 is formed. (FIG. 12B.)

A process of forming the EL element (a process of forming the pixel electrode, the EL layer, and the cathode) is performed in the pixel portion in this state. A mask material is used so that the cathode 347 and the EL layer 348 are not formed in the region shown in FIGS. 12A to 12C. After then forming the EL layer 348, the anode 349 is formed. The anode 349 and the input-output wiring 1109 are thus electrically connected. In addition, the state of FIG. 12C is obtained by forming the second passivation film 350.

Through the foregoing steps, the contact structure of the region indicated by 1108 of FIG. 11B is realized. The input-output wiring line 1109 is electrically connected to the FPC 611 through a gap between the housing member 1104 and the substrate 1100 (however, the gap is filled with the adhesive 1105). Note that although the description has been made here on the input wiring line 1109, other output wiring lines 612 to 614 are also connected to the FPC 611 through the portion under the housing member 1104 in the same manner.

Embodiment 2

Figure 13:
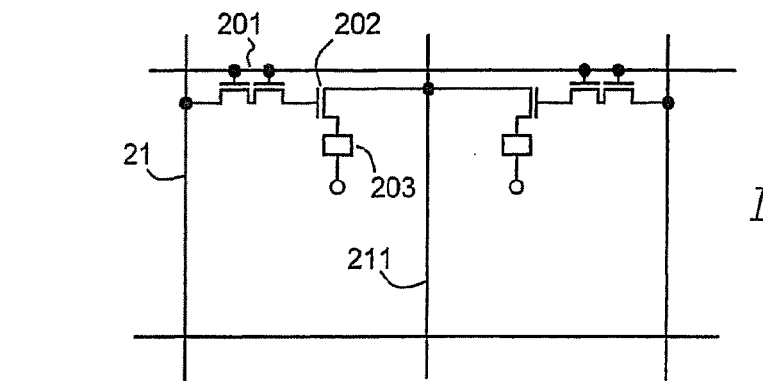
FIG. 13 is a diagram showing the composition of a pixel portion of an EL display device.

In this embodiment, an example in which a structure of a pixel is made different from the structure shown in FIG. 3B will be described with reference to FIG. 13.

The two pixels shown in FIG. 3B are arranged to become symmetrical with respect to the power supply line 211 which imparts a ground electric potential. In other words, by sharing the power supply line 212 between two pixels, as shown in FIG. 13, the number of necessary wirings can be reduced. Note that structures such as the TFT structures placed within the pixels remain as is.

If such structure is adopted, it becomes possible to manufacture a more minute pixel portion, and the quality of an image is improved.

Note that the structure of this embodiment can be easily realized in accordance with the manufacturing steps of the embodiment 1, and with respect to the TFT structure or the like, the description of the embodiment 1 or FIG. 2 may be referred to.

Embodiment 3

Cases of using top gate type TFTs were explained by embodiment 1 and embodiment 2, but the present invention is not limited to a TFT structure, and it may also be implemented using a bottom gate type TFT (typically a reverse stagger type TFT). Further, the reverse stagger type TFT may be formed by any means.

The reverse stagger type TFT is a good structure having fewer processes than the top gate type TFT and it is therefore extremely advantageous in lowering manufacturing costs, an object of the present invention.

Embodiment 4

In the EL display devices explained by embodiment mode 1 and embodiment 1, by giving the switching TFTs in the pixels a multi-gate structure, the value of the off current of the switching TFT is reduced, and the necessity of a storage capacitor is eliminated. This is a design for effectively utilizing the exclusive surface area of the storage capacitor as a light emitting region.

However, even without completely eliminating the storage capacitor, by making its exclusive surface area smaller, an effect of enlarging the light emitting surface area can be obtained. Namely, it is sufficient to reduce the value of the off current and to shrink the size of the exclusive surface area of the storage capacitor by making the switching TFT into a multi-gate structure.

Figure 14:
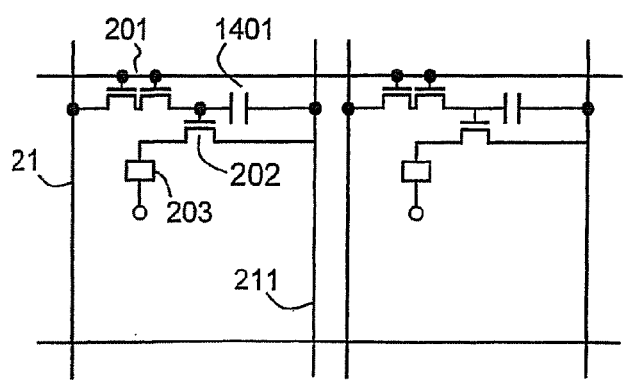
FIG. 14 is a diagram showing the composition of a pixel portion of an EL display device.

In this case a storage capacitor 1401 may also be formed with respect to the switching TFT 201, in parallel with the gate of the current control TFT 202, as shown in FIG. 14.

Note that the constitution of embodiment 4 can be freely combined with the constitutions of any one of embodiments 1 to 3. Namely, a storage capacitor is provided in the pixel and there is no limit on the TFT structure or EL layer materials, etc.

Embodiment 5

Laser crystallization is used as the means of forming the crystalline silicon film 302 in embodiment 1, but a case of using a different means of crystallization is explained in embodiment 5.

Crystallization is performed in embodiment 5 by using the technique recorded in Japanese Patent Application Laid-open No. 7-130652 after forming an amorphous silicon film. The technique recorded in the above patent application is one of obtaining a crystalline silicon film having good crystallinity by using an element such as nickel as a catalyst for promoting crystallization.

Further, after completing the crystallization process, a process of removing the catalyst used in crystallization may also be performed. In this case, the catalyst may be gettered by the technique recorded in Japanese Patent Application Laid-open No. 10-270363 or in Japanese Patent Application Laid-open No. 8-330602.

Furthermore, the TFT may also be formed by using the technique recorded in Japanese Patent Application Laid-open No. 11-076967 by the applicant of the present invention.

The manufacturing process shown in embodiment 1 is thus one exemplary, and provided that the structures shown in FIG. 1, FIG. 2, or in FIG. 6C of embodiment 1 can be realized, then other manufacturing processes may also be used without problems.

Note that it is possible to freely combine the constitution of embodiment 5 with the constitutions of any one of embodiments 1 to 4.

Embodiment 6

Analog driving using an analog signal as a pixel signal can be performed when driving the EL display device of the present invention, and digital driving using a digital signal can also be performed.

When performing analog driving, an analog signal is sent to a source wiring line of a switching TFT, and the analog signal containing gradation information becomes a gate voltage of a current control TFT. The current flowing in an EL element is then controlled by the current control TFT, and gradation display is performed by controlling the strength of the light emitted by the EL element.

When performing digital driving, on the other hand, gradation display referred to as time partitioned driving is performed, differing from analog gradation display. Namely, by regulating the length of time of light emission, color gradations are shown to be changing visually.

The response speed of the EL element is extremely fast compared with that of a liquid crystal element, and it is possible to drive it at high speed. It can therefore be said that the EL element is suitable for time partition driving in which one frame is partitioned into a plurality of subframes and then gradation display is performed.

The present invention is thus a technique related to element structures, and therefore any driving method may be used.

Embodiment 7

An example of using an organic EL material as an EL layer is shown in embodiment 1, but the present invention can also be implemented using an inorganic EL material. However, present inorganic EL materials have extremely high driving voltages, and therefore a TFT having voltage resistance characteristics which can withstand the high driving voltages must be used when performing analog driving.

Alternatively, if an inorganic EL material having a lower driving voltage is developed in the future, it will be possible to apply this to the present invention.

Furthermore, it is possible to freely combine the constitution of embodiment 7 with the constitutions of any of embodiments 1 to 6.

Embodiment 8

Figure 15:
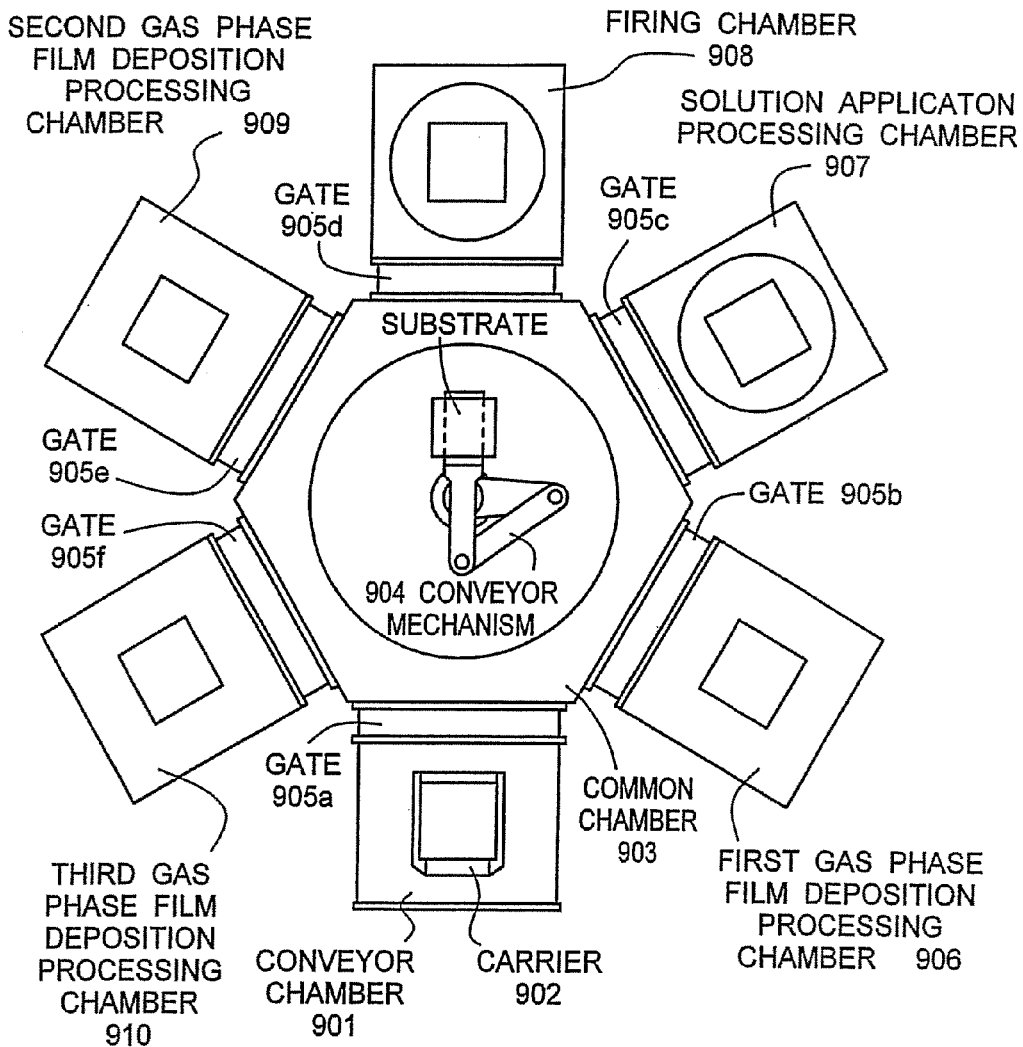
FIG. 15 is a diagram showing an external view of a thin film formation apparatus.

An example of forming an EL element using the thin film forming apparatus shown in FIG. 15 is shown in embodiment 8. In FIG. 15, reference numeral 901 denotes a conveyor chamber for performing insertion or extraction of a substrate, and is also referred to as a load-lock chamber. In embodiment 8, a substrate, on which processing is performed in accordance with the steps of embodiment 1 up to the formation of the pixel electrode 346 of FIG. 6B, is first set into a carrier 902. Note that the conveyor chamber 901 may also be separated in to a substrate insertion chamber and a substrate extraction chamber.

Reference numeral 903 denotes a common chamber containing a mechanism for conveying the substrate (hereafter referred to as a conveyor mechanism). A plurality of processing chambers (denoted by reference numerals 906 to 910) are connected to the common chamber 903 through gates 905a to 905f.

In order to completely seal off each of the processing chambers from the common chamber 903 by the gates 905a to 905f, airtight seals are obtained. It therefore becomes possible to perform processing under a vacuum by installing an evacuation pump in each of the processing chambers. It is possible to use a rotary oil pump, a mechanical booster pump, a turbo molecular pump, or a cryopump as the evacuation pump, but it is preferable to use the cryopump which is effective in removing moisture.

The substrate is then transported to the common chamber 903 by the conveyor mechanism 904, and is next transported to a first gas phase film deposition processing chamber 906. Cathode formation by evaporation or sputtering is performed in the first gas phase film deposition processing chamber 906. A MgAg alloy in which magnesium and silver are evaporated together at a ratio of 10:1 is used as the cathode material in embodiment 8.

Next, the substrate is transported from the first gas phase film deposition processing chamber 906 to a solution application processing chamber 907. A solution containing an EL material is applied by spin coating in the liquid application processing chamber 907, forming a polymer precursor containing a high molecular weight (polymer) EL material. A solution of polyvinylcarbazole dissolved in chloroform is used as the solution containing the EL material in embodiment 8. Of course, other high molecular weight EL materials (typically materials such as polyphenylenevinylene or polycarbonate) or other organic solvents (typically solvents such as dichloromethane or tetrahydrofuran) may also be combined.

The substrate is then transported from the solution application processing chamber 907 to a firing chamber 908. The EL material is polymerized by firing (heat treatment) in the firing chamber 908. Heat treatment is performed in embodiment 8 at a temperature of 50 to 150° C. (preferably between 110 and 120° C.) with respect to the entire substrate by heating the stage with a heater. Excess chloroform is thus vaporized and the high molecular weight light emitting layer made from polyvinylcarbazole is formed. This single layer light emitting layer is used as the EL layer in embodiment 8.

The substrate is next transported from the firing chamber 908 to a second gas phase film deposition processing chamber 909. An anode made from a transparent conducting film is formed on the high molecular weight light emitting layer (EL layer) in the second gas phase film deposition processing chamber 909. A compound of 10 to 15% zinc oxide mixed into indium oxide is used in embodiment 8.

Next, the substrate is conveyed from the second gas phase film deposition processing chamber 909 to a third gas phase film deposition processing chamber 910. A passivation film made from an insulating film, preferably an insulating film containing silicon, is formed in the third gas phase film deposition processing chamber 910. The passivation layer is formed in order to protect the EL layer from moisture and oxygen.

The substrate is then conveyed from the third gas phase film deposition processing chamber 910 to the carrier 902 placed in the conveyor chamber 901. The series processing using the thin film formation apparatus of FIG. 15 is thus completed.

The advantage of using the thin film formation apparatus shown in FIG. 15 is that processing can be performed in succession from the formation of the cathode to the formation of the passivation layer, without the substrate once being exposed to the atmosphere (in particular, moisture). In other words, all processing is performed under a vacuum or under a dry inert gas atmosphere, and therefore degradation of the light emitting layer is avoided.

In addition, a processing chamber for preforming spin coating is also installed in the same thin film formation apparatus, and therefore it is possible to form the EL element using a high molecular weight EL material. When forming the EL layer by evaporation or sputtering, a gas phase film deposition processing chamber may of course be installed as a substitute for the solution application processing chamber and the firing chamber.

Note that the thin film formation apparatus shown in embodiment 8 can be used when forming the EL element in the manufacturing process of embodiment 1. Therefore, it is also possible to use the thin film formation apparatus of embodiment 8 to obtain the structures shown in embodiments 2 to 7 using the manufacturing processes of embodiment 1.

Embodiment 9

An active matrix type EL display device (EL module) formed by implementing the present invention has superior visibility in bright locations compared with liquid crystal display device because the EL display device is a self-emitting type. Its use as a direct view EL display device (indicating a display incorporating the EL module) are therefore wide.

Note that one advantage of the EL display over the liquid crystal display that can be given is its wide viewing angle. The EL display of the present invention may therefore be used as a display (display monitor) having a diagonal size equal to or greater than 30 inches (typically equal to or greater than 40 inches) in appreciating broadcasts such as TV broadcasts on a large size screen.

Further, the present invention can be used not only as an EL display (such as in a personal computer monitor, a TV broadcast receiving monitor, or an advertisement display monitor), but can also be used as a display for various electronic devices.

The following can be given as examples of such electronic devices: a video camera; a digital camera; a goggle type display (head mounted display); a game machine; a car navigation system; a personal computer; a portable information terminal (such as a mobile computer, a portable telephone, or an electronic book); and an image playback device furnished with a recording medium (specifically, a device furnished with a display which can play back and display recording mediums such as a compact disk (CD), a laser disk (LD), or a digital video disk (DVD)). Examples of these electronic devices are shown in FIGS. 17A to 17F.

Figure 17A:
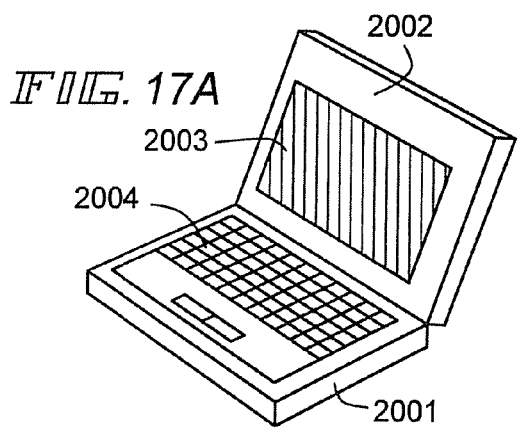
FIGS. 17A to 17F are diagrams showing specific examples of electronic devices.

FIG. 17A is a personal computer, and contains components such as a main body 2001, a casing 2002, a display device 2003, and a keyboard 2004. The present invention can be used in the display device 2003.

Figure 17B:
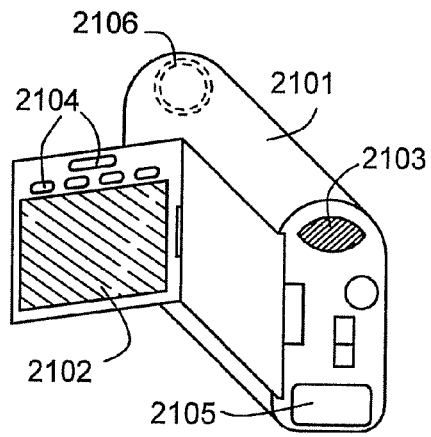

FIG. 17B is a video camera, and contains components such as a main body 2101, a display device 2102, a sound input portion 2103, operation switches 2104, a battery 2105, and an image receiving portion 2106. The present invention can be used in the display device 2102.

Figure 17C:
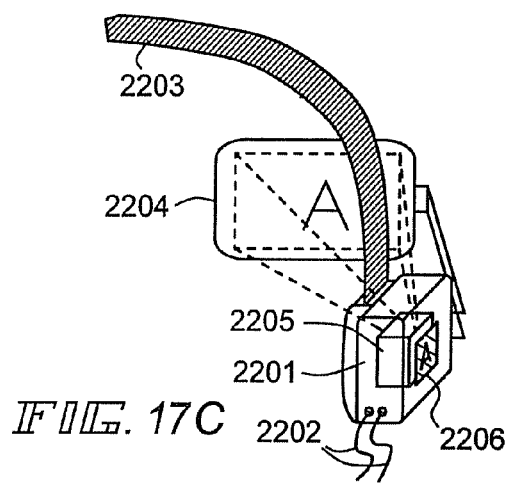

FIG. 17C is a portion (right side) of an EL display which is attached to one's head, and contains components such as a main body 2201, a signal cable 2202, a head fixing band 2203, a display monitor 2204, an optical system 2205, and a display device 2206. The present invention can be used in the display device 2206.

Figure 17D:
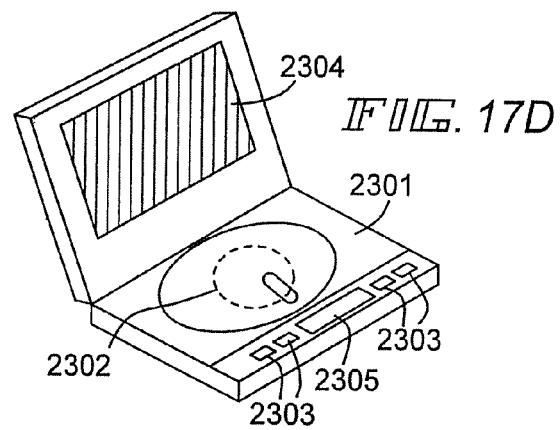

FIG. 17D is an image playback device furnished with a recording medium (specifically, a DVD playback device), and contains components such as a main body 2301, a recording medium (such as a CD, an LD, or a DVD) 2302, operation switches 2303, a display device (a) 2304, and a display device (b) 2305. The display device (a) mainly displays image information. The display device (b) mainly displays character information, and the present invention can be used in the display device (a) and in the display device (b). Note that the present invention can be used in image playback devices, furnished with a recording medium, such as a CD playback device and a game machine.

Figure 17E:
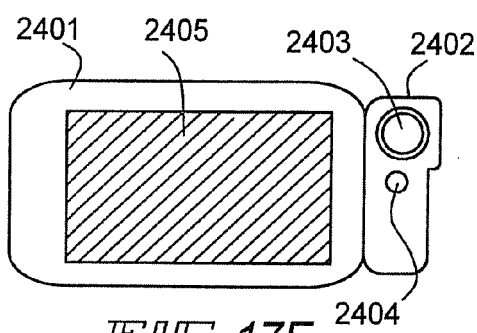

FIG. 17E is a mobile computer, and contains components such as a main body 2401, a camera portion 2402, an image receiving portion 2403, operation switches 2404, and a display device 2405. The present invention can be used in the display device 2405.

Figure 17F:
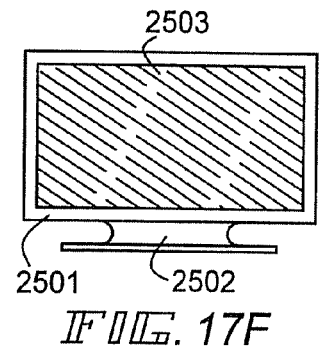

FIG. 17F is an EL display, and contains components such as a casing 2501, a support table 2502, and a display device 2503. The present invention can be used in the display device 2503. The EL display is advantageous for cases of making large sized screens because it has a wider angle of view compared with a liquid crystal display, and is advantageous in displays having a diagonal equal to or greater than 10 inches (especially for those having a diagonal equal to or greater than 30 inches).

Further, if the brightness of the light emitted from EL materials increases in the future, it will become possible to use the present invention in a front type or a rear type projector by projecting light containing the output image information which is expanded by a lens.

The applicable range of the present invention is thus extremely wide, and it is possible to apply the present invention to electronic devices of all fields. Furthermore, the constitutions of embodiments 1 to 8 can be freely combined and used in obtaining the electronic devices of embodiment 9.

Embodiment 10

An example of manufacturing an active matrix type EL display device by processes differing from those of embodiment 1 is shown in embodiment 10. FIGS. 5A to 18E are used in the explanation.

First, a base film 1801 is formed with a thickness of 300 nm on a glass substrate 1800 in accordance with the processes of embodiment 1. In embodiment 10, a lamination of silicon nitride oxide films formed in succession without breaking the vacuum is used as the base film 1801. The concentration of nitrogen contacting the glass substrate 1800 may be set from 10 to 25 wt % at this point.

In addition, an amorphous silicon film (not shown in the figures) is formed with a thickness of 50 nm on the base film 1801 by a known film deposition method. The amorphous silicon film is formed in succession after formation of the base film 1801, without breaking the vacuum. Note that it is not necessary to limit this film to the amorphous silicon film, and that provided that it is a semiconductor film containing an amorphous structure (including microcrystalline semiconductor films), other films may also be used. In addition, compound semiconductor films containing an amorphous structure such as an amorphous silicon germanium film may also be used. Further, the film thickness may be set from 20 to 100 nm.

The amorphous silicon film not shown in the figures is crystallized next by employing excimer laser light using XeCl gas. The laser light crystallization process is also performed in succession after formation of the amorphous silicon film without breaking the vacuum. A crystalline silicon film 1802 is thus formed.

In addition, a first gate insulating film 1803 is formed on the crystalline silicon film 1802 with a thickness of 5 to 100 nm (preferably between 10 and 30 nm). A silicon oxide film is used as the first gate insulating film 1803 in embodiment 10. The first gate insulating film 1803 is also formed in succession after forming the crystalline silicon film 1802 without breaking the vacuum. The state of FIG. 18A is thus obtained.

The base film formation process, the amorphous silicon film formation process, the amorphous silicon film crystallization process (the crystalline silicon film formation process) and the first gate insulating film formation process are thus characterized in that all are performed successively without breaking the vacuum (without exposure to the atmosphere). This type of successive process can be realized by using a multi-chamber method (also referred to as a cluster tool method) provided with a plurality of film deposition chambers and a laser crystallization chamber.

Next, the crystalline silicon film 1802 is patterned by photolithography, and island shape semiconductor films 1804 to 1807 are formed. (See FIG. 18B.)

A second gate insulating film 1808 is formed next so as to cover the island shape semiconductor films 1804 to 1807. In a region which functions essentially as a gate insulating film, the first gate insulating film 1803 and the second gate insulating film 1808 have a lamination structure. However, it is preferable to form the first gate insulating film 1803 with a thin film thickness of 10 to 30 nm, and therefore the film thickness of the second gate insulating film 1808 may be regulated within the range of 10 to 120 nm.

Resist masks 1809a and 1809b are formed next, and a processing of adding an n-type conductivity element is performed. This process may be performed under the same conditions as those of the process of FIG. 4B in embodiment 1. N-type impurity regions 1810 and 1811 containing an n-type impurity element with a concentration from $2\times10^{16}$ to $5\times10^{19}$ atoms/cm$^3$ (typically $5\times10^{17}$ atoms/cm$^3$ to $5\times10^{18}$ atoms/cm$^3$) are thus formed. (See FIG. 18D.)

The resist masks 1809a and 1809b are next removed, and a process of activating the n-type impurity elements is performed. The process of FIG. 4C of embodiment 1 may be referred to for this process. (See FIG. 18E.)

Subsequent processing may be performed in accordance with the steps of embodiment 1 from FIG. 4E onward. An active matrix type EL display device like that explained by embodiment 1 can thus be manufactured.

Note that the constitution of embodiment 10 can be freely combined with the composition of any of embodiments 2 to 4, 6, and 7, and that the apparatus of embodiment 8 may be used in manufacturing an EL element. Furthermore, the electronic devices shown in embodiment 9 may use the EL display device manufactured by implementing embodiment 10.

Embodiment 11

An example of manufacturing an active matrix type EL display device by processes differing from those of embodiment 1 is shown in embodiment 11. FIGS. 19A to 19D are used in the explanation.

In embodiment 11, the technique recorded in Japanese Patent Application Laid-open No. Hei 7-130652 is used in forming the crystalline silicon film 302 shown in FIG. 4A of embodiment 1. Namely, nickel is used as a catalytic element which promotes crystallization of an amorphous silicon film in embodiment 11. Processes of FIG. 4B onward are then performed, and the state of FIG. 5A is obtained.

Resist masks 1901a and 1901b are formed next, and a process of adding an n-type impurity element (phosphorus in embodiment 11) is performed in this state. FIG. 5B of embodiment 1 may be referred to for the addition conditions at this point. N-type impurity regions 1902 to 1909 are thus formed. (See FIG. 19A.)

The resist masks 1901a and 1901b are removed next, and a protecting film 1910 is formed. A process of activating the n-type impurity elements added to the n-type impurity regions 1902 to 1909 by furnace annealing using an electric furnace is then performed. Activation is performed at 500 to 600° C., and the nickel used in crystallizing the crystalline silicon film 302 moves to the n-type impurity regions 1902 to 1909 by a phosphorus gettering action at this point. The nickel gettering process and the phosphorus activation process are therefore combined in the process of FIG. 19B.

A resist mask 1911 is formed next, and a process of adding a p-type impurity element (boron in embodiment 11) is performed. FIG. 5C of embodiment 1 may be referred to for the addition conditions at this time. P-type impurity regions 1912 and 1913 are thus formed. (See FIG. 19C.)

An interlayer insulating film 1914 made from a silicon nitride oxide film is formed next, and a hydrogenation process is performed in this state. Hydrogen within the interlayer insulating film 1914 is made to diffuse within an active layer by heat treatment at 300 to 450° C. in this hydrogenation process. Further, boron added to the p-type impurity regions 1912 and 1913 is activated at the same time. The hydrogenation process and the boron activation process are therefore combined in the process of FIG. 19D. The p-type impurity regions are activated at the same time as hydrogenated, and therefore a phenomenon of the value of the off current of a p-channel TFT becoming higher in a region of high gate voltage can be controlled.

Note that the hydrogenation process and the boron activation process may also be performed separately. In other words, after the step of FIG. 19C, the boron activation process may be performed at 500 to 600° C., and the hydrogenation process can be performed next at 300 to 400° C. It is preferable to perform this when there are cases in which boron activation is insufficient because the hydrogenation process temperature is low.

After thus obtaining the state of FIG. 19D, subsequent processes may be performed in accordance with the processes of FIG. 6A onward in embodiment 1. Note that the interlayer insulating film 1914 may be a portion of the first interlayer insulating film 336 shown in FIG. 6A. An active matrix type EL display device like that explained by embodiment 1 can thus be manufactured.

Note that the constitution of embodiment 11 can be freely combined with the composition of any of embodiments 2 to 7 and 10, and that the apparatus of embodiment 8 may be used in manufacturing an EL element. Furthermore, the electronic devices shown in embodiment 9 may use the EL display device manufactured by implementing embodiment 11.

Reflection of light emitted from an EL layer by a cathode surface becomes a diffuse reflection by implementing the present invention, and a problem of an observer's face or the surrounding environment being reflected in an image display portion of an EL display device can be solved.

Furthermore, it becomes unnecessary to use a high price film such as a circular polarization film, and therefore it is possible to reduce the cost of the EL display device and electronic devices using the EL display device.

What is claimed is:

1. An EL display device comprising:
   a switching transistor and a current control transistor formed over a substrate, each of the switching transistor and the current control transistor including an active layer, a gate electrode and a first insulating film between the active layer and the gate electrode;

a first source wiring and a first drain wiring electrically connected to the active layer of the switching transistor;

a second source wiring and a second drain wiring electrically connected to the active layer of the current control transistor;

a second insulating film having a contact hole formed over the switching transistor, the current control transistor, a first source wiring, a first drain wiring, a second source wiring and the second drain wiring;

a first electrode having a plurality of projecting portions formed over the second insulating film and electrically connected to one of the second source wiring and the second drain wiring through the contact hole;

an EL layer formed over the first electrode;

a second electrode formed over the EL layer; and a third insulating film formed over the second electrode and being in contact with an edge of the second insulating film, wherein one of the first source wiring and the first drain wiring is electrically connected to the gate electrode of the current control transistor.

2. The EL display device according to claim 1, wherein a spacing between the plurality of projecting portions is in the range of 0.05 to 1 μm.

3. The EL display device according to claim 1, wherein each of the second insulating film and the third insulating film is a passivation film.

4. The EL display device according to claim 1, wherein the first electrode comprises a pixel electrode and a cathode.

5. The EL display device according to claim 1, further comprising:

an input-output wiring line formed over the substrate and being electrically connected to the second electrode, wherein the third insulating film is in contact with the input-output wiring line.

6. An electronic device having the EL display device according to claim 1, wherein the electronic device is one selected from the group consisting of a video camera, a goggle type display, a game machine, a car navigation system, a personal computer, a mobile computer, a portable telephone, an electronic book, an image playback device and an EL display.

7. An EL display device comprising:

a first insulating film formed over a substrate;

a switching transistor and a current control transistor formed the first insulating film, each of the switching transistor and the current control transistor including an active layer, a gate electrode and a second insulating film between the active layer and the gate electrode;

a first source wiring and a first drain wiring electrically connected to the active layer of the switching transistor;

a second source wiring and a second drain wiring electrically connected to the active layer of the current control transistor;

a third insulating film having a contact hole formed over the switching transistor, the current control transistor, a first source wiring, a first drain wiring, a second source wiring and the second drain wiring;

a first electrode having a plurality of projecting portions formed over the second insulating film and electrically connected to one of the second source wiring and the second drain wiring through the contact hole;

an EL layer formed over the first electrode;

a second electrode formed over the EL layer; and a fourth insulating film formed over the second electrode and being in contact with an edge of the third insulating film, wherein one of the first source wiring and the first drain wiring is electrically connected to the gate electrode of the current control transistor.

8. The EL display device according to claim 7, wherein a spacing between the plurality of projecting portions is in the range of 0.05 to 1 μm.

9. The EL display device according to claim 7, wherein each of the third insulating film and the fourth insulating film is a passivation film.

10. The EL display device according to claim 7, wherein the first electrode comprises a pixel electrode and a cathode.

11. The EL display device according to claim 7, further comprising:

an input-output wiring line formed over the first insulating film and being electrically connected to the second electrode, wherein the fourth insulating film is in contact with the input-output wiring line.

12. An electronic device having the EL display device according to claim 7, wherein the electronic device is one selected from the group consisting of a video camera, a goggle type display, a game machine, a car navigation system, a personal computer, a mobile computer, a portable telephone, an electronic book, an image playback device and an EL display.

13. An EL display device comprising:

a switching transistor and a current control transistor formed over a substrate, each of the switching transistor and the current control transistor including an active layer, a gate electrode and a first insulating film between the active layer and the gate electrode;

a first source wiring and a first drain wiring electrically connected to the active layer of the switching transistor;

a second source wiring and a second drain wiring electrically connected to the active layer of the current control transistor;

a second insulating film having a first contact hole formed over the switching transistor, the current control transistor, a first source wiring, a first drain wiring, a second source wiring and the second drain wiring;

a third insulating film having a second contact hole and comprising an organic resin formed over the second insulating film;

a first electrode having a plurality of projecting portions formed over the third insulating film and electrically connected to one of the second source wiring and the second drain wiring through the first contact hole and the second contact hole;

an EL layer formed over the first electrode;

a second electrode formed over the EL layer; and a fourth insulating film formed over the second electrode and being in contact with an edge of the second insulating film and an edge of the third insulating film, wherein one of the first source wiring and the first drain wiring is electrically connected to the gate electrode of the current control transistor.

14. The EL display device according to claim 13, wherein a spacing between the plurality of projecting portions is in the range of 0.05 to 1 μm.

15. The EL display device according to claim 13, wherein each of the second insulating film and the fourth insulating film is a passivation film.

16. The EL display device according to claim 13, wherein the first electrode comprises a pixel electrode and a cathode.

17. The EL display device according to claim 13, further comprising:

an input-output wiring line formed over the substrate and being electrically connected to the second electrode, wherein the fourth insulating film is in contact with the input-output wiring line.

18. An electronic device having the EL display device according to claim 13, wherein the electronic device is one selected from the group consisting of a video camera, a goggle type display, a game machine, a car navigation system, a personal computer, a mobile computer, a portable telephone, an electronic book, an image playback device and an EL display.

* * * * *

UNITED STATES PATENT AND TRADEMARK OFFICE
CERTIFICATE OF CORRECTION

PATENT NO. : 7,710,028 B2  Page 1 of 1
APPLICATION NO. : 12/208528
DATED : May 4, 2010
INVENTOR(S) : Shunpei Yamazaki It is certified that error appears in the above-identified patent and that said Letters Patent is hereby corrected as shown below:

In The Specification:

Column 2, Line 20, Change "1-999" to -- 1999 --.

Column 5, Line 7, Change "W" to -- W1 --.

Column 7, Line 1, Change "BCE" to -- BCB --.

Column 11, Line 66, Change "inbetween" to -- in between --.

Column 14, Line 33, Change "LDO" to -- LDD --.

Column 16, Line 58, Change "FIG. 11" to -- FIG. 11B --.

Column 19, Line 60, Change "in to" to --into --.

Column 20, Line 27, Change "polyphenylenevinylene" to -- polyphenylene vinylene --.

Column 22, Line 40, Change "FIGS. 5A to 18E " to -- FIGS. 18A to 18E --.

In The Claims:

Column 25, Claim 1, Line 9, After "transistor," (2nd occurrence) Delete "a" and insert -- the --.

Column 25, Claim 1, Line 10, After "wiring" (1st occurrence) Delete "a" and insert -- the --.

Column 25, Claim 1, Line 10, After "wiring" (2nd occurrence) Delete "a" and insert -- the --.

Column 25, Claim 7, Line 59, After "transistor" (2nd occurrence) Delete "a" and insert -- the --.

Column 25, Claim 7, Line 60, After "wiring" (1st occurrence) Delete "a" and insert -- the --.

Column 25, Claim 7, Line 60, After "wiring" (2nd occurrence) Delete "a" and insert -- the --.

Column 26, Claim 13, Line 42, After "transistor" (1st occurrence) Delete "a" and insert -- the --.

Column 26, Claim 13, Line 42, After "wiring" (1st occurrence) Delete "a" and insert -- the --.

Column 26, Claim 13, Line 42, After "wiring" (2nd occurrence) Delete "a" and insert -- the --.

Signed and Sealed this

Twenty-sixth Day of October, 2010

David J. Kappos
*Director of the United States Patent and Trademark Office*